US011087696B2

(12) United States Patent
Kim et al.

(10) Patent No.: US 11,087,696 B2
(45) Date of Patent: Aug. 10, 2021

(54) DISPLAY DEVICE AND METHOD OF MANUFACTURING THE SAME

(71) Applicant: Samsung Display Co., Ltd., Yongin-si (KR)

(72) Inventors: Myoung Hwa Kim, Seoul (KR); Masataka Kano, Hwaseong-si (KR); Yeon Keon Moon, Hwaseong-si (KR); Joon Seok Park, Yongin-si (KR); Jun Hyung Lim, Seoul (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/739,012

(22) Filed: Jan. 9, 2020

(65) Prior Publication Data
US 2020/0234654 A1     Jul. 23, 2020

(30) Foreign Application Priority Data
Jan. 17, 2019  (KR) ........................ 10-2019-0006406

(51) Int. Cl.
| G09G 3/30 | (2006.01) |
| G09G 3/36 | (2006.01) |
| G06F 3/038 | (2013.01) |
| G09G 5/00 | (2006.01) |
| G09G 3/3291 | (2016.01) |
| G09G 3/3266 | (2016.01) |
| H01L 51/56 | (2006.01) |
| H01L 51/52 | (2006.01) |

(52) U.S. Cl.
CPC ......... *G09G 3/3291* (2013.01); *G09G 3/3266* (2013.01); *H01L 51/5281* (2013.01); *H01L 51/56* (2013.01); *H01L 2251/308* (2013.01)

(58) Field of Classification Search
CPC .................. H01L 27/3262; H01L 27/3276
See application file for complete search history.

(56) References Cited

U.S. PATENT DOCUMENTS

| 10,355,163 B1* | 7/2019 | Zha ...................... H01L 27/153 |
| 2008/0017885 A1* | 1/2008 | Ishii ..................... H01L 27/124 257/203 |
| 2009/0128723 A1* | 5/2009 | Saito .................... G09G 3/3655 349/37 |
| 2010/0019996 A1* | 1/2010 | You ..................... H01L 27/1225 345/76 |
| 2012/0286265 A1* | 11/2012 | Takechi ............ H01L 29/78693 257/43 |

(Continued)

FOREIGN PATENT DOCUMENTS

| KR | 10-2016-0120394 | 10/2016 |
| KR | 10-2018-0071538 | 6/2018 |

(Continued)

*Primary Examiner* — Nan-Ying Yang
(74) *Attorney, Agent, or Firm* — H.C. Park & Associates, PLC

(57) ABSTRACT

A display device including: a pixel connected to a scan line and a data line intersecting the scan line. The pixel includes a light emitting element and a driving transistor which controls a driving current supplied to the light emitting element according to a data voltage applied from the data line. The driving transistor includes a first active layer including an oxide semiconductor doped with a metal.

16 Claims, 32 Drawing Sheets

(56) References Cited

U.S. PATENT DOCUMENTS

| | | | |
|---|---|---|---|
| 2015/0187959 A1 | 7/2015 | Yoon | |
| 2015/0206931 A1* | 7/2015 | Choi | H01L 29/78675 257/72 |
| 2015/0333115 A1 | 11/2015 | Yang | |
| 2016/0300950 A1 | 10/2016 | Lee et al. | |
| 2016/0380039 A1* | 12/2016 | Oh | H01L 27/3262 257/40 |
| 2017/0032733 A1* | 2/2017 | Jang | H01L 29/78633 |
| 2018/0175127 A1 | 6/2018 | Lee et al. | |
| 2018/0308871 A1* | 10/2018 | Wu | G09G 3/3233 |

FOREIGN PATENT DOCUMENTS

| | | |
|---|---|---|
| KR | 10-2018-0077954 | 7/2018 |
| KR | 10-2018-0127882 | 11/2018 |

\* cited by examiner

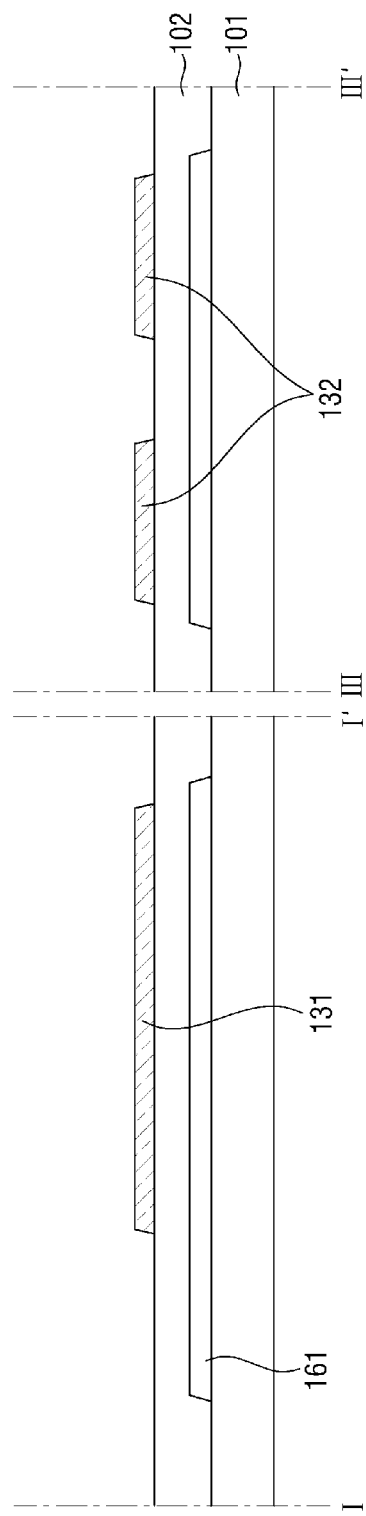

DISPLAY DEVICE AND METHOD OF MANUFACTURING THE SAME

CROSS REFERENCE TO RELATED APPLICATION

This application claims priority from and the benefit of Korean Patent Application No. 10-2019-0006406, filed on Jan. 17, 2019, which is hereby incorporated by reference for all purposes as if fully set forth herein.

BACKGROUND

Field

Exemplary embodiments of the present invention relate to a display device and a method of manufacturing the same.

Discussion of the Background

As the information society develops, the demand for display devices for displaying images is increasing in various forms. Accordingly, various display devices, such as liquid crystal displays (LCDs), plasma display panels (PDPs), and light emitting displays are being utilized. Light emitting displays include organic light emitting displays using organic light emitting diodes as light emitting elements and light emitting diode displays using micro-light emitting diodes as light emitting elements.

Such a flat panel display device includes a display panel, a gate driver circuit, a data driver circuit, and a timing controller. The display panel includes data lines, gate lines, and pixels formed at intersections of the data lines and the gate lines. Each of the pixels receives a data voltage from a data line when a gate signal is supplied to a gate line using a thin-film transistor as a switching element. Each of the pixels emits light of a predetermined brightness according to the data voltage.

Recently, flat panel display devices capable of displaying images having ultra-high definition (UHD) are being released, and flat panel display devices capable of displaying images with a high resolution of 8K UHD are being developed. The UHD represents a resolution of 3840×2160, and 8K UHD represents a resolution of 7680×4320.

In the case of a high-resolution flat panel display device, as the number of pixels increases, a driving current of each of the pixels may be reduced, thereby reducing the driving voltage range of a driving transistor of each of the pixels.

The above information disclosed in this Background section is only for understanding of the background of the inventive concepts, and, therefore, it may contain information that does not constitute prior art.

SUMMARY

Exemplary embodiments of the present invention provide a display device capable of increasing the driving voltage range of a driving transistor of each pixel.

Exemplary embodiments of the present invention also provide a method of manufacturing a display device capable of increasing the driving voltage range of a driving transistor of each pixel.

Additional features of the inventive concepts will be set forth in the description which follows, and in part will be apparent from the description, or may be learned by practice of the inventive concepts.

An exemplary embodiment of the present invention provides a display device including: a pixel connected to a scan line and a data line intersecting the scan line. The pixel includes a light emitting element and a driving transistor which controls a driving current supplied to the light emitting element according to a data voltage applied from the data line. The driving transistor includes a first active layer having an oxide semiconductor doped with a metal.

The proportion of the metal in the first active layer may be about 10 atomic % or less.

The metal may be copper (Cu), arsenic (As), antimony (Sb), lanthanum (La), a mixture of silver (Ag) and nitrogen (N), a mixture of boron (B) and nitrogen (N), or a mixture of gallium (Ga) and nitrogen (N).

The metal may be copper (Cu), and the oxide semiconductor may include tin (Sn).

The first active layer may include indium-gallium-tin oxide (IGTO) or indium-gallium-zinc-tin oxide (IGZTO).

The metal may be doped into an upper surface of the first active layer.

The metal may be doped into at least one side surface of the first active layer.

The first active layer may include a first conducting region, a second conducting region, and a channel region disposed between the first conducting region and the second conducting region.

The driving transistor may include: a first light shielding layer disposed under the first active layer; a first gate electrode disposed on the first active layer; a first source electrode connected to the first conducting region through a first contact hole passing through an interlayer insulating film disposed on the first gate electrode; and a first drain electrode connected to the second conducting region through a second contact hole passing through the interlayer insulating film.

The first source electrode may contact the first light shielding layer through a third contact hole passing through the interlayer insulating film and an insulating layer disposed between the first active layer and the first light shielding layer.

The pixel may include a scan transistor for applying the data voltage of the data line to the first gate electrode of the driving transistor according to a scan signal transmitted to the scan line. The scan transistor may include a second active layer having an oxide semiconductor.

The second active layer may be not doped with the metal.

The scan transistor may further include: a second light shielding layer disposed under the second active layer and a second gate electrode disposed on the second active layer.

The second gate electrode may contact the second light shielding layer through a sixth contact hole passing through a gate insulating layer disposed between the second active layer and the second gate electrode and an insulating layer disposed between the second active layer and the second light shielding layer.

The display device may further include a scan driver circuit which outputs a scan signal to the scan line. The scan driver circuit may include a pull-up transistor which outputs a gate-on voltage when the pull-up transistor is charged with the gate-on voltage. The pull-up transistor may include a third active layer having an oxide semiconductor.

The third active layer may be not doped with the metal.

The pull-up transistor may further include a third light shielding layer disposed under the third active layer and a third gate electrode disposed on the third active layer.

The third gate electrode may contact the third light shielding layer through a ninth contact hole passing through a gate insulating layer disposed between the third active layer and the third gate electrode and an insulating layer disposed between the third active layer and the third light shielding layer.

The display device may further include a data voltage distribution circuit which includes a first distribution transistor connected between a routing line and the data line and a second distribution transistor connected between the routing line and another data line adjacent to the data line. Each of the first distribution transistor and the second distribution transistor may include a fourth active layer having polysilicon.

Another exemplary embodiment of the present invention provides a method of manufacturing a display device, the method including: forming a first light shielding layer on a first substrate and forming a buffer layer on the first light shielding layer; forming an active layer on the entire surface of the buffer layer; patterning a photoresist on the active layer; forming a metal film on the photoresist and the active layer not covered by the photoresist and then etching the metal film to dope the exposed active layer with a metal; forming a first active layer by removing the photoresist and patterning the active layer; forming a first gate insulating layer on the first active layer and forming a first gate electrode on the first gate insulating layer; and forming a first interlayer insulating film on the first gate electrode and forming a first source electrode and a first drain electrode on the first interlayer insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is a circuit diagram of an example of a scan driver circuit illustrated in

FIG. 2.

FIGS. 18A, 18B, 18C, 18D, 18E, 18F, and 18G are cross-sectional views for explaining the method of manufacturing a display device according to an exemplary embodiment.

DETAILED DESCRIPTION

Figure 1:
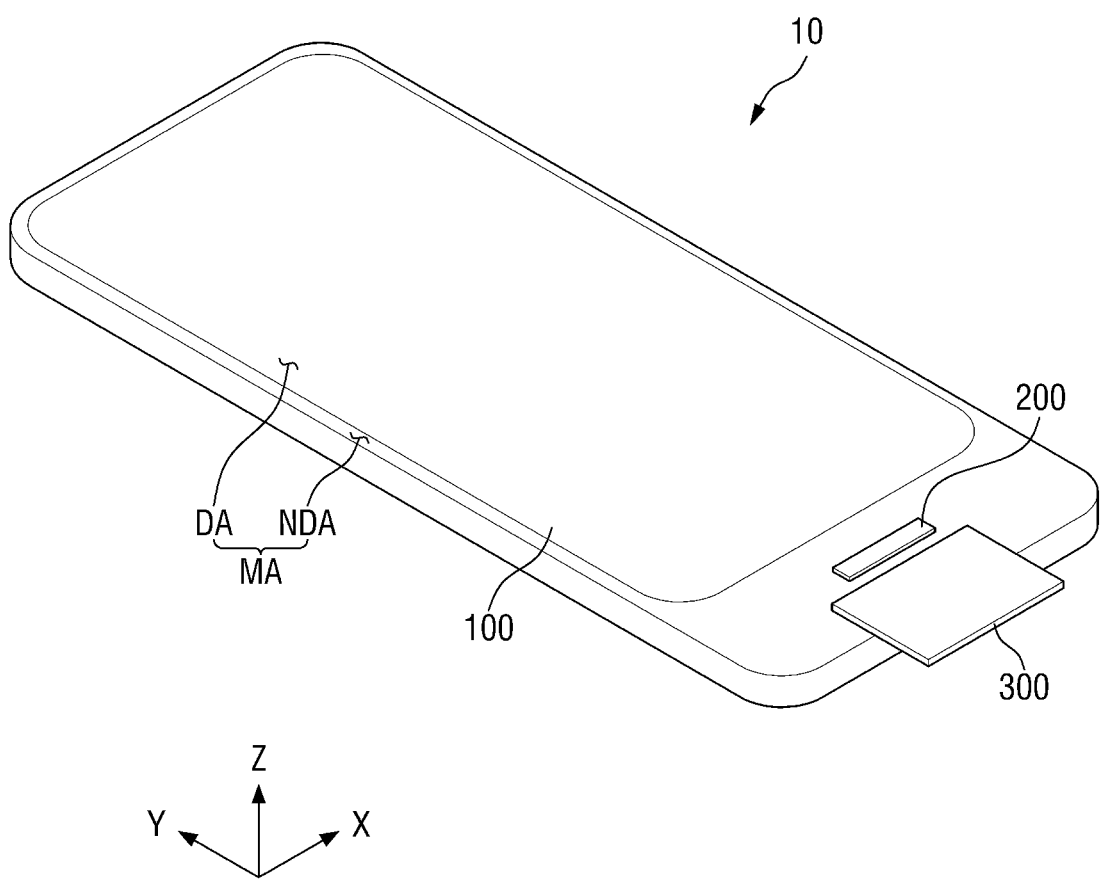
FIG. 1 is a perspective view of a display device according to an exemplary embodiment.

In the following description, for the purposes of explanation, numerous specific details are set forth in order to provide a thorough understanding of various exemplary embodiments of the invention. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
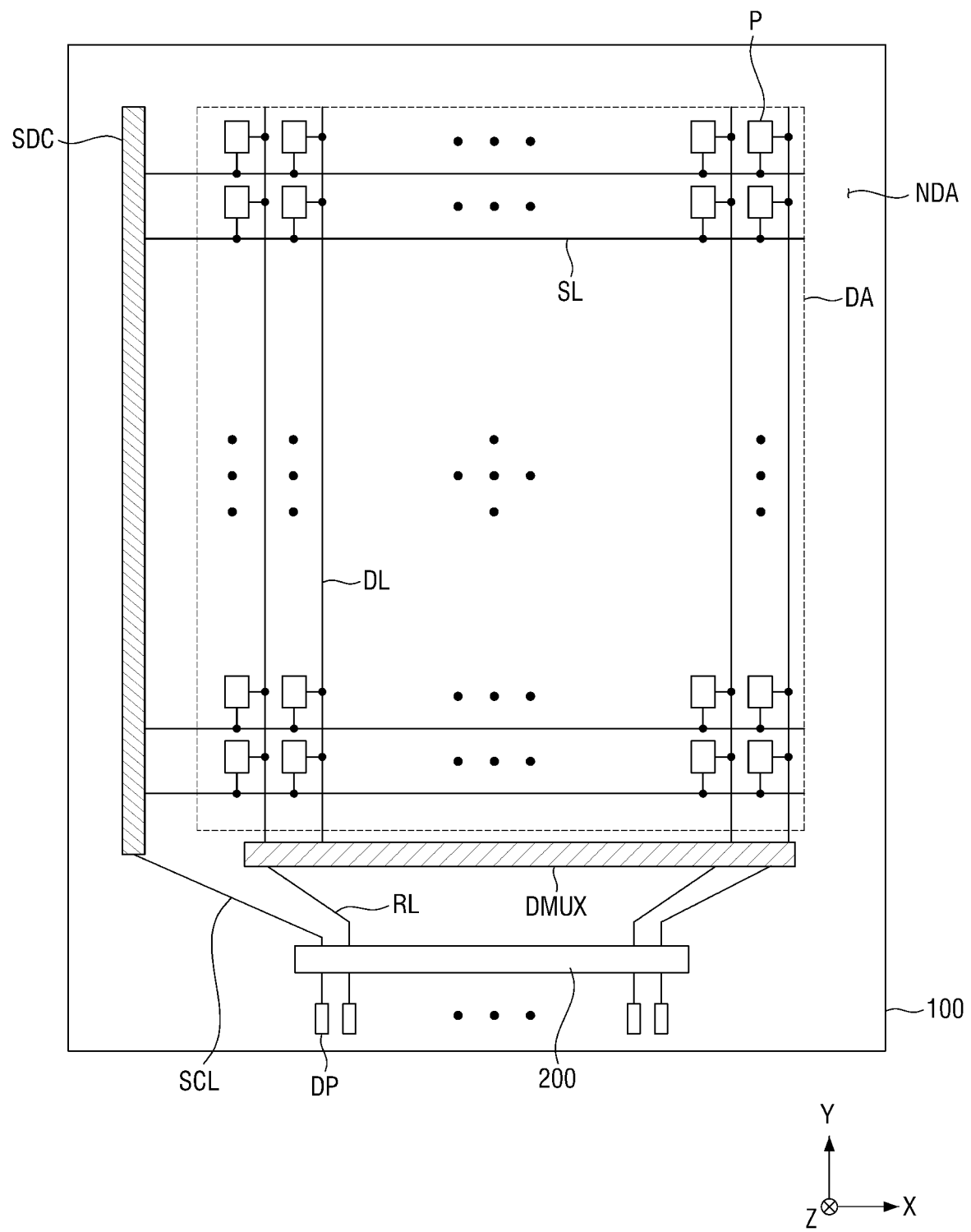
FIG. 2 is a plan view of an example of the display device according to an exemplary embodiment.

FIG. 1 is a perspective view of a display device 10 according to an exemplary embodiment. FIG. 2 is a plan view of an example of the display device 10 according to this exemplary embodiment.

In the present specification, the terms "on" "top" and "upper surface" indicate a direction upward from a display panel 100, that is, a Z-axis direction, and the terms "under," "botto" and "lower surface" indicate a direction downward from the display panel 100, that is, a direction opposite to the Z-axis direction. In addition, "left," "right," "upper" and "lower" indicate directions when the display panel 100 is viewed in a plane. For example, "left" indicates a direction opposite to an X-axis direction, "In" indicates the X-axis direction, "upper" indicates a Y-axis direction, and "lower" indicates a direction opposite to the Y-axis direction.

Referring to FIGS. 1 and 2, the display device 10 is a device for displaying moving images or still images. The display device 10 may be used as a display screen in portable electronic devices such as a mobile phone, a smartphone, a tablet personal computer (PC), a smart watch, a watch phone, a mobile communication terminal, an electronic notebook, an electronic book, a portable multimedia player (PMP), a navigation system and a ultra-mobile PC (UMPC), as well as in various products such as a television, a notebook computer, a monitor, a billboard and the Internet of things. The display device 10 may be any one of an organic light emitting display, a liquid crystal display, a plasma display, a field emission display, an electrophoretic display, an electrowetting display, a quantum dot light emitting display, and a micro light emitting diode (LED) display. An organic light emitting display will hereinafter be described as an example of the display device 10, but the inventive concepts are not limited to the organic light emitting display.

The display device 10 according to an exemplary embodiment includes the display panel 100, a display driver circuit 200, and a circuit board 300.

The display panel 100 may be formed as a rectangular plane having short sides in a first direction (X-axis direction) and long sides in a second direction (Y-axis direction). Each corner where a long side extending in the first direction (X-axis direction) meets a short side extending in the second direction (Y-axis direction) may be rounded with a predetermined curvature or may be right-angled. The planar shape of the display panel 100 is not limited to the rectangular shape, but may also be another polygonal shape, a circular shape, or an elliptical shape. The display panel 100 may be formed flat. However, the display panel 100 is not limited to this example and may also include a curved portion formed at its left and right ends and having a constant curvature or a varying curvature. In addition, the display panel 100 may be formed flexible so that it can be curved, bent, folded, or rolled.

The display panel 100 may include a display area DA where a plurality of pixels P are formed to display an image and a non-display area NDA disposed around the display area DA. When the display panel 100 includes a curved portion, the display area DA may be disposed in the curved portion. In this case, an image may also be displayed on the curved portion of the display panel 100.

In the display area DA, not only the pixels P but also scan lines SL, data lines DL and power supply lines connected to the pixels P may be disposed. The scan lines SL may be formed parallel to each other in the first direction (X-axis direction), and the data lines DL may be formed parallel to each other in the second direction (Y-axis direction) intersecting the first direction (X-axis direction). Each of the pixels P may be connected to at least any one of the scan liens SL and any one of the data lines DL.

Each of the pixels P may include a driving transistor DT, at least one switching transistor ST, a light emitting element EL, and a capacitor Cst. Since the switching transistor ST is turned on by a scan signal received from a scan line SL, a data voltage of a data line DL may be applied to a gate electrode of the driving transistor DT. The driving transistor DT may supply a driving current to the light emitting element EL according to the data voltage applied to the gate electrode. The light emitting element EL may emit light according to the driving current. The driving transistor DT and the at least one switching transistor ST may be thin-film transistors. The light emitting element may emit light according to the driving current of the driving transistor DT. The light emitting element EL may be an organic light emitting diode including a first electrode, an organic light emitting layer, and a second electrode. The capacitor Cst may maintain the data voltage applied to the gate electrode of the driving transistor DT constant.

The non-display area NDA may be defined as an area extending from the outside of the display area DA to edges of the display panel 100. In the non-display area NDA, a scan driver circuit SDC for transmitting scan signals to the scan lines SL and a data voltage distribution circuit DMUX connected between the data lines DL and routing lines RL may be disposed. In addition, pads DP electrically connected to the display drier circuit 200 and the circuit board 300 may be disposed in the non-display area NDA. In this case, the display driver circuit 200 and the pads DP may be disposed on an edge of the display panel 100.

The scan driver circuit SDC may be connected to the display driver circuit 200 through at least one scan control line SCL. The scan driver circuit SDC may receive a scan control signal from the display driver circuit 200 through the at least one scan control line SCL. The scan driver circuit SDC may generate scan signals according to the scan control signal and sequentially output the scan signals to the scan lines SL. Although the scan driver circuit SDC is formed in the non-display area NDA on a side (e.g., a left side) of the display area DA in FIG. 2, the inventive concepts are not limited to this case. For example, the scan driver circuit SDC may also be formed in the non-display area NDA on both sides (e.g., left and right sides) of the display area DA.

The data voltage distribution circuit DMUX may be connected between the routing lines RL and the data lines DL. A ratio of the number of the routing lines RL connected to the data voltage distribution circuit DMUX to the number of the data lines DL connected to the data voltage distribution circuit DMUX may be 1:q, where q is an integer equal to or greater than 2. The data voltage distribution circuit DMUX may distribute data voltages applied to one routing line RL to a plurality of data lines DL.

The display driver circuit 200 is connected to the display pads DP and receives digital video data and timing signals. The display driver circuit 200 converts the digital video data into analog positive/negative polarity data voltages and supplies the analog positive/negative polarity data voltages to the data lines DL through the routing lines RL and the data voltage distribution circuit DMUX. In addition, the display driver circuit 200 generates the scan control signal for controlling the scan driver circuit SDC and supplies the scan control signal to the scan driver circuit SDC through the scan control line SCL. Pixels P to be supplied with the data voltages are selected by the scan signals of the scan driver circuit SDC, and the data voltages are supplied to the selected pixels P. In addition, the display driver circuit 200 may supply power supply voltages to the power supply lines.

The display driver circuit 200 may be formed as an integrated circuit (IC) and mounted on a pad area PDA of the display panel 100 using a chip-on-glass (COG) method, a chip-on-plastic (COP) method, or an ultrasonic bonding method. However, the inventive concepts are not limited to this case, and the display driver circuit 200 may also be mounted on the circuit board 300.

The pads DP may be electrically to the display driver circuit 200. The circuit board 300 may be attached onto the pads DP using an anisotropic conductive film. Therefore, lead lines of the circuit board 300 may be electrically connected to the pads DP. The circuit board 300 may be a flexible printed circuit board, a printed circuit board, or a flexible film such as a chip on film.

Figure 3:
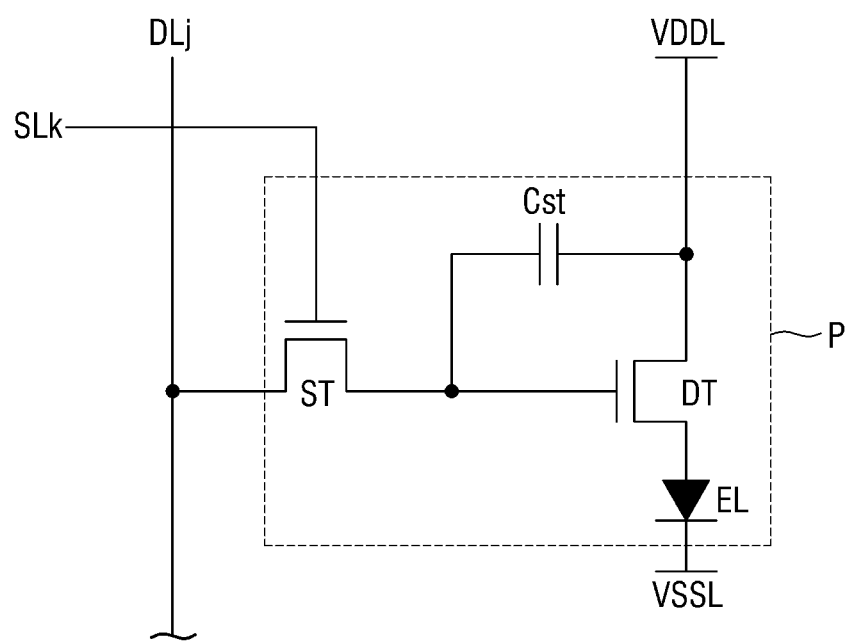
FIG. 3 is a circuit diagram of an example of a pixel illustrated in FIG. 2.

FIG. 3 is a circuit diagram of an example of a pixel P illustrated in FIG. 2.

Referring to FIG. 3, a pixel P may include a driving transistor DT, at least one switching transistor ST, a light emitting element EL, and a capacitor Cst.

The switching transistor ST is turned on by a scan signal received from a $k^{th}$ scan line SLk (where k is a positive integer). Therefore, a data voltage of a $j^{th}$ data line DLj (where j is a positive integer) may be applied to a gate electrode of the driving transistor DT. The switching transistor ST may have a gate electrode connected to the $k^{th}$ scan line SLk, a source electrode connected to the gate electrode of the driving transistor DT, and a drain electrode connected to the $j^{th}$ data line DLj.

The driving transistor DT may supply a driving current to the light emitting element EL according to the data voltage applied to the gate electrode. The light emitting element may emit the light according to the driving current. The driving transistor DT may have the gate electrode connected to the drain electrode of the switching transistor ST, a source electrode connected to a first electrode of the light emitting element EL, and a drain electrode connected to a first power supply line VDDL to which a first power supply voltage is applied.

The driving transistor DT and the at least one switching transistor ST may be thin-film transistors. In addition, although the driving transistor DT and the at least one switching transistor ST are formed as N-type semiconductor transistors having N-type semiconductor characteristics in FIG. 3, the inventive concepts are not limited to this case. That is, the driving transistor DT and the at least one switching transistor ST may also be formed as P-type semiconductor transistors having P-type semiconductor characteristics.

The light emitting element EL may emit light according to the driving current of the driving transistor DT. The light emitting element EL may be an organic light emitting diode including the first electrode, an organic light emitting layer, and a second electrode. The first electrode of the light emitting element EL may be connected to the drain electrode of the driving transistor DT, and the second electrode may be connected to a second power supply line VSSL to which a second power supply voltage lower than the first power supply voltage is applied.

The capacitor Cst may be connected between the gate electrode and the source electrode of the driving transistor DT. Therefore, the capacitor Cst may maintain the data voltage applied to the gate electrode of the driving transistor DT constant.

Figure 4:
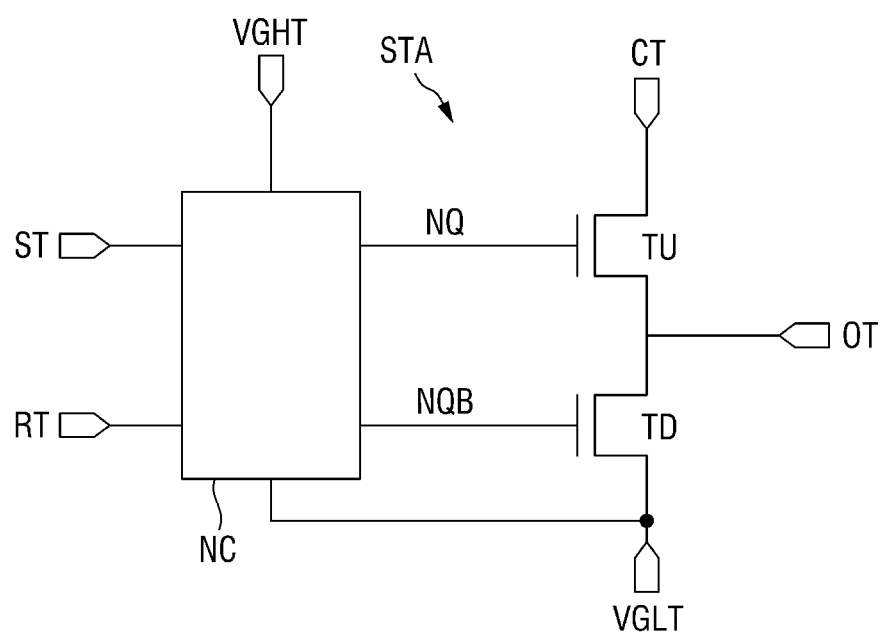

FIG. 4 is a circuit diagram of an example of the scan driver circuit SDC illustrated in FIG. 2.

A scan driver circuit SDC may include stages connected in a dependent manner. The stages may sequentially output scan signals to the scan lines SL. A stage STA is shown in FIG. 4 for the convenience of the explanation.

As illustrated in FIG. 4, each of the stages STA includes a pull-up node NQ, a pull-down node NQB, a pull-up transistor TU which is turned on when the pull-up node NQ has a gate-on voltage, a pull-down transistor TD which is turned on when the pull-down node NQB has a gate-on voltage, and a node controller NC for controlling charging and discharging of the pull-up node NQ and the pull-down node NQB.

The node controller NC may be connected to a start terminal ST to which a start signal or an output signal of a previous stage is input, a reset terminal RT to which an output signal of a next stage is input, a gate-on voltage terminal VGHT to which a gate-on voltage is applied, and a gate-off voltage terminal VGLT to which a gate-off voltage is applied. The node controller NC controls charging and discharging of the pull-up node NQ and the pull-down node NQB according to the start signal or the output signal of the previous stage input to the start terminal ST. In order to stably control an output of a stage STA, the node controller NC controls the pull-down node NQB to have a gate-off voltage when the pull-up node NQ has a gate-on voltage and controls the pull-up node NQ to have a gate-off voltage when the pull-down node NQB has a gate-on voltage. To this end, the node controller NC may include a plurality of transistors.

The pull-up transistor TU is turned on when the stage STA is pulled up, that is, when the pull-up node NQ has a gate-on voltage and outputs a clock signal, which is input to a clock terminal CT, to an output terminal OT. The pull-down transistor TD is turned on when the stage STA is pulled down, for example, when the pull-down node NQB has a gate-on voltage and outputs a gate-off voltage of the gate-off voltage terminal VGLT to the output terminal OT.

The pull-up transistor TU, the pull-down transistor TD, and the transistors of the node controller NC of the stage STA may be formed as thin-film transistors. In addition, although the pull-up transistor TU, the pull-down transistor TD, and the transistors of the node controller NC of the stage STA are formed as N-type semiconductor transistors having N-type semiconductor characteristics in FIG. 4, the inventive concepts are not limited to this case. That is, the pull-up transistor TU, the pull-down transistor TD and the transistors of the node controller NC of the stage STA may also be formed as P-type semiconductor transistors having P-type semiconductor characteristics.

Figure 5:
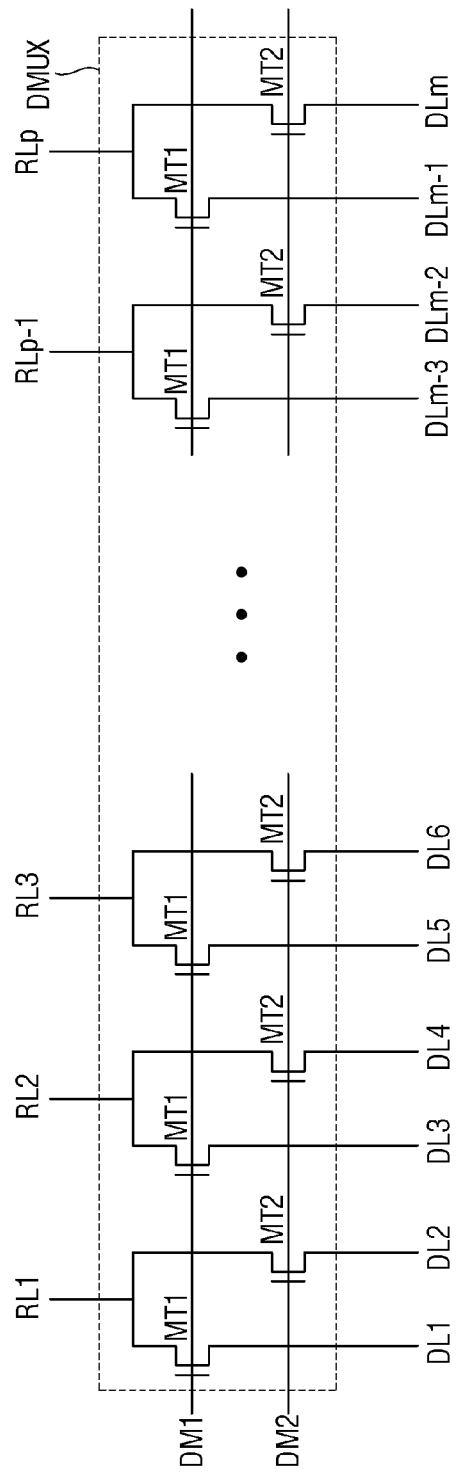
FIG. 5 is a circuit diagram of an example of a data voltage distribution circuit illustrated in FIG. 2.

FIG. 5 is a circuit diagram of an example of the data voltage distribution circuit DMUX illustrated in FIG. 2.

Referring to FIG. 5, a data voltage distribution circuit DMUX may time-divide data voltages supplied to routing lines RL1 through RLp (where p is an integer equal to or greater than 2) and distribute the data voltages to a plurality of data lines DL1 through DLm (where m is an integer satisfying m=2p) by using distribution transistors MT1 and MT2 sequentially turned on by distribution control signals transmitted to distribution control lines DM1 and DM2. In FIG. 5, the data voltage distribution circuit DMUX time-divides data voltages supplied to one routing line and distributes the data voltage to two data lines. However, embodiments are not limited to this case.

The data voltage distribution circuit DMUX may include first distribution transistors MT1 and second distribution transistors MT2. Respective gate electrodes of the first distribution transistors MT1 may be connected to a first distribution control line DM1, and respective gate electrodes of the second distribution transistors MT2 may be connected to a second distribution control line DM2.

The first distribution transistor MT1 and the second distribution transistor MT2 connected to one routing line may be connected to different data lines. For example, the first distribution transistor MT1 connected to a first routing line RL1 may be connected to a first data line DL1, and the second distribution transistor MT2 connected to the first routing line RL1 may be connected to a second data line DL2. The first distribution transistor MT1 connected to a $p^{th}$ routing line RLp may be connected to an $(m-1)^{th}$ data line DLm-1, and the second distribution transistor MT2 connected to the $p^{th}$ routing line RLp may be connected to an $m^{th}$ data line DLm.

When a first distribution control signal of a gate-on voltage is transmitted to the first distribution control line DM1, the first distribution transistors MT1 may be turned on. Accordingly, the routing lines RL1 through RLp may be connected to odd-numbered data lines DL, DL3, DL5, . . . , DLm-1. When a second distribution control signal of a gate-on voltage is transmitted to the second distribution control line DM2, the second distribution transistors MT2 may be turned on. Accordingly, the routing lines RL1 through RLp may be connected to even-numbered data lines DL2, DL4, DL6, . . . , DLm. Therefore, the data voltage distribution circuit DMUX may time-divide data voltages supplied to the routing lines RL1 through RLp (where p is an integer equal to or greater than 2) and distribute the data voltages to the data lines DL1 through DLm (where m is an integer satisfying m=2p).

The first distribution transistors MT1 and the second distribution transistors MT2 of the data voltage distribution circuit DMUX may be formed as thin-film transistors. In addition, although the first distribution transistors MT1 and the second distribution transistors MT2 of the data voltage distribution circuit DMUX are formed as N-type semiconductor transistors having N-type semiconductor characteristics in FIG. 5, the inventive concepts are not limited to this case. That is, the first distribution transistors MT1 and the second distribution transistors MT2 of the data voltage distribution circuit DMUX may also be formed as P-type semiconductor transistors having P-type semiconductor characteristics.

Figure 6:
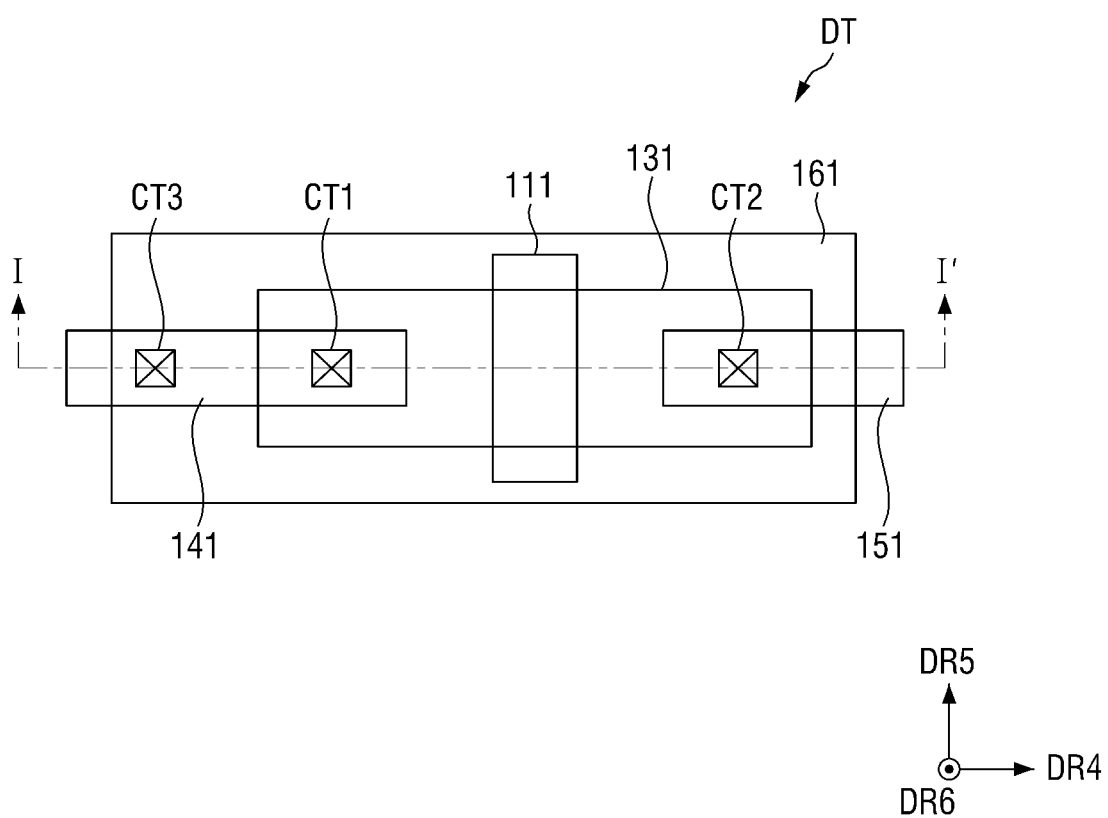
FIG. 6 is a plan view of an example of a driving transistor of the pixel illustrated in FIG. 3.
Figure 7:
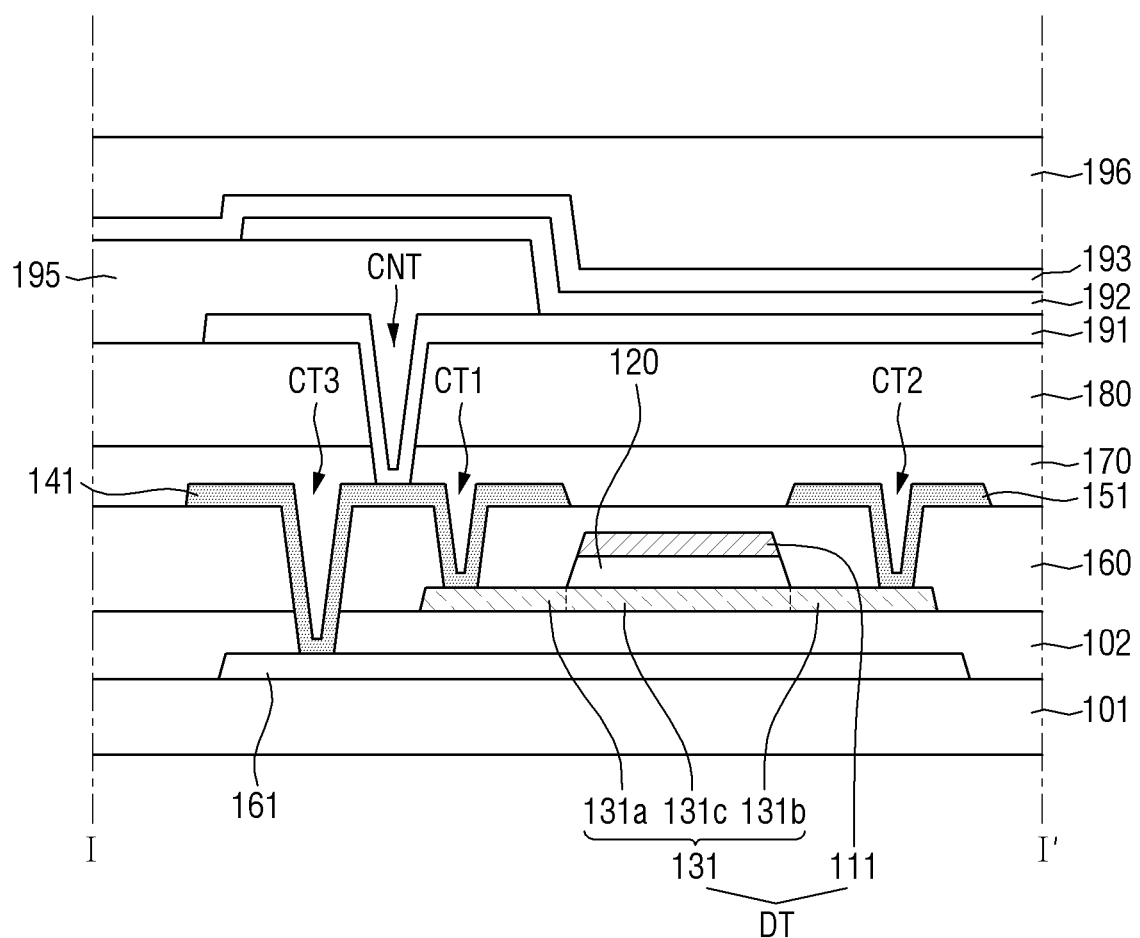
FIG. 7 is an example cross-sectional view taken along I-I' of FIG. 6.
Figure 8:
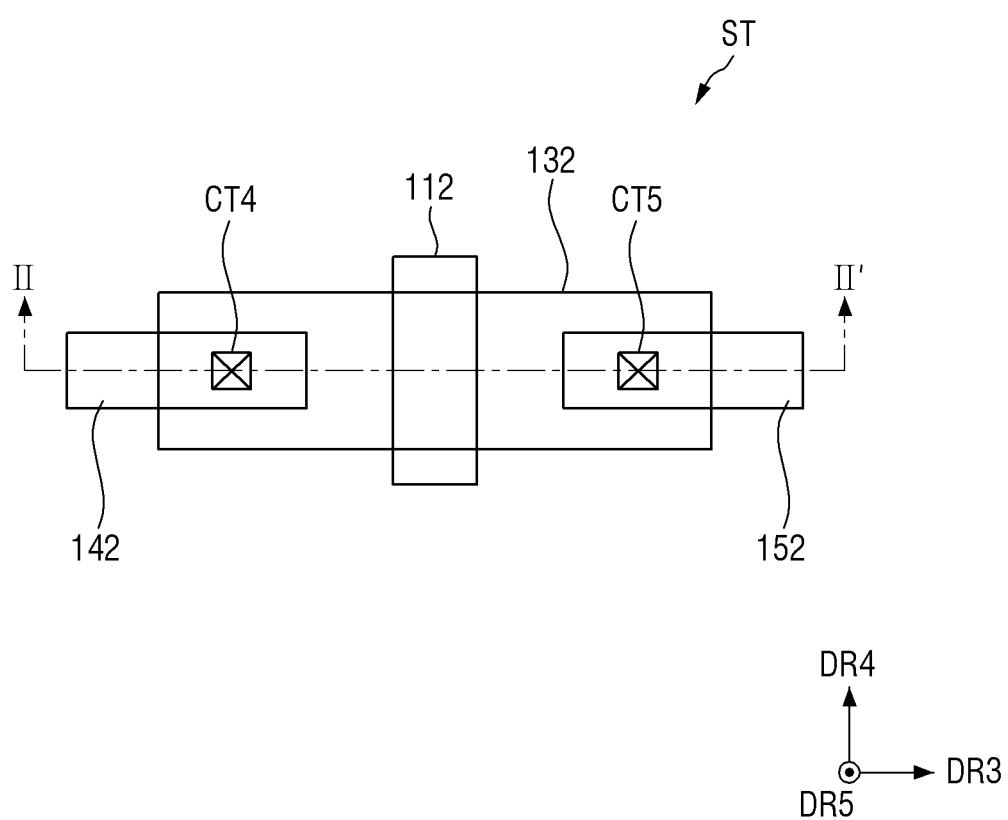
FIG. 8 is a plan view of an example of a switching transistor of the pixel illustrated in FIG. 3.
Figure 9:
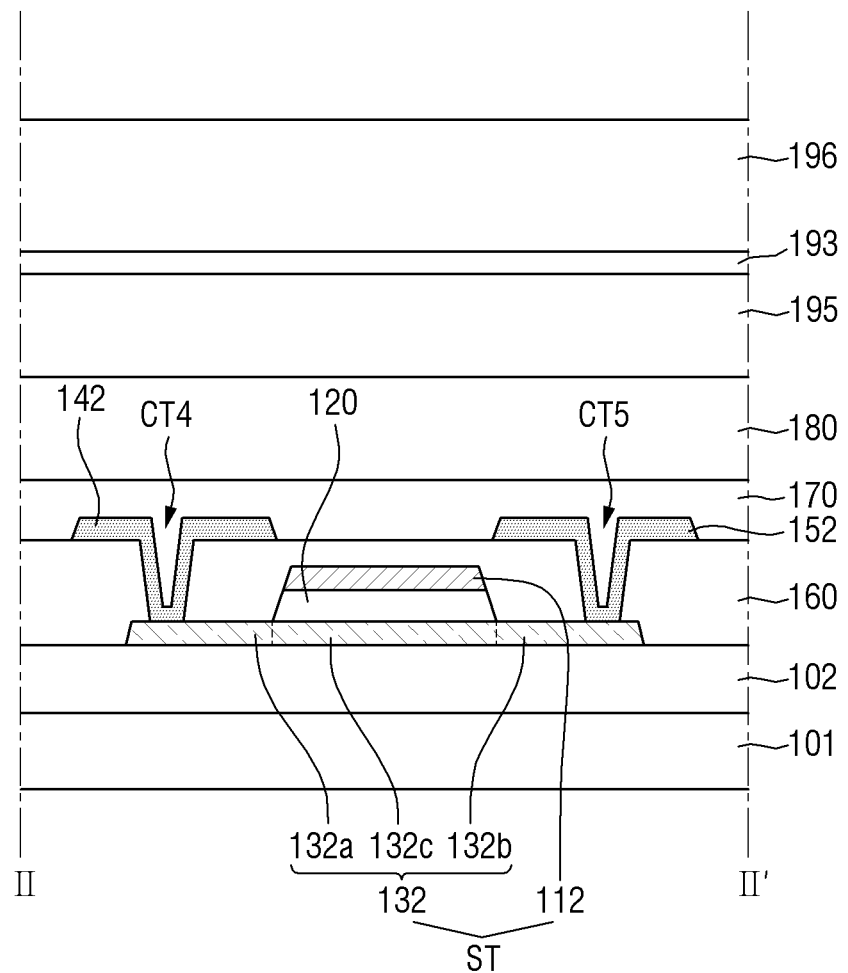
FIG. 9 is an example cross-sectional view taken along II-II' of FIG. 8.

FIG. 6 is a plan view of an example of the driving transistor DT of the pixel P illustrated in FIG. 3. FIG. 7 is an example cross-sectional view taken along I-I' of FIG. 6. FIG. 8 is a plan view of an example of a switching transistor of the pixel illustrated in FIG. 3. FIG. 9 is an example cross-sectional view taken along II-IF of FIG. 8.

In FIGS. 6 through 9, a driving transistor DT and a switching transistor ST of a pixel P are formed in a coplanar structure. The coplanar structure has a top gate structure in which a gate electrode is formed on an active layer.

Referring to FIGS. 6 through 9, the driving transistor DT of the pixel P includes a first gate electrode 111, a first active layer 131, a first source electrode 141, a first drain electrode 151, and a first light shielding layer 161. The switching transistor ST of the pixel P includes a second gate electrode 112, a second active layer 132, a second source electrode 142, and a second drain electrode 152.

The driving transistor DT and the switching transistor ST are formed on a first substrate 101. The first substrate 101 may be made of plastic or glass.

The first light shielding layer 161 may be formed on the first substrate 101. The first light shielding layer 161 is a layer for blocking light from the first substrate 101 from entering the first active layer 131. The first light shielding layer 161 is designed to prevent a leakage current of the first active layer 131 when light from the first substrate 101 is incident on the first active layer 131. Lengths of the first light shielding layer 161 in a fourth direction DR4 and a fifth direction DR5 may be greater than lengths of the first active layer 131 in the fourth direction DR4 and the fifth direction DR5. The first light shielding layer 161 may be a single layer or a multilayer made of any one or more of molybdenum (Mo), aluminum (Al), chromium (Cr), gold (Au), titaniumTi), nickel (Ni), neodymium (Nd), copper (Cu), and alloys of these materials.

A buffer layer 102 may be formed on the first light shielding layer 161. The buffer layer 102 is a layer for protecting the driving transistor DT and the switching transistor ST of the pixel P from moisture introduced through the first substrate 101. The buffer layer 102 may be composed of a plurality of inorganic layers stacked alternately. For example, the buffer layer 102 may be a multilayer in which one or more inorganic layers selected from a silicon oxide ($SiO_x$) layer, a silicon nitride ($SiN_x$) layer, and SiON are alternately stacked.

The first active layer 131 and the second active layer 132 may be formed on the buffer layer 102. The first active layer 131 and the second active layer 132 may include first conducting regions 131a and 132a, second conducting regions 131b and 132b, and channel regions 131c and 132c, respectively. The channel regions 131c and 132c may be disposed between the first conducting regions 131a and 132a and the second conducting regions 131b and 132b.

The first active layer 131 and the second active layer 132 may be oxide semiconductors. The first active layer 131 may be an oxide semiconductor doped with a metal, and the second active layer 132 may be an oxide semiconductor not doped with a metal. The metal doped into the first active layer 131 may be copper (Cu), arsenic (As), antimony (Sb), lanthanum (La), a mixture of silver (Ag) and nitrogen (N), a mixture of boron (B) and nitrogen (N), or a mixture of gallium (Ga) and nitrogen (N).

The metal doped into the first active layer 131 may be formed only on an upper surface of the first active layer 131 or may be formed on upper and side surfaces of the first active layer 131 depending on a manufacturing process. In addition, the proportion of the metal doped into the first active layer 131 in the first active layer 131 may be about 10 atomic % or less in order to prevent the first conducting region 131a and the second conducting region 131b from short-circuiting due to the metal.

In order to prevent the first active layer 131 from being damaged in the metal doping process, the first active layer 131 and the second active layer 132 may be oxide semiconductors containing tin (Sn). In this case, the first active layer 131 and the second active layer 132 may be made of indium-gallium-tin oxide (IGTO) or indium-gallium-zinc-tin oxide (IGZTO). For example, if the first active layer 131 is an oxide semiconductor containing tin (Sn) and a metal to be doped into the first active layer 131 is copper (Cu), a copper metal film may be formed on the first active layer 131, and then copper (Cu) may be doped into the first active layer 131 using an etchant that reacts with copper (Cu) and does not react with the first active layer 131. In this case, the etchant that reacts with copper (Cu) and does not react with the first active layer 131 may be a non-hydrogen peroxide solution including citric acid or ammonium persulfate.

Figure 10:
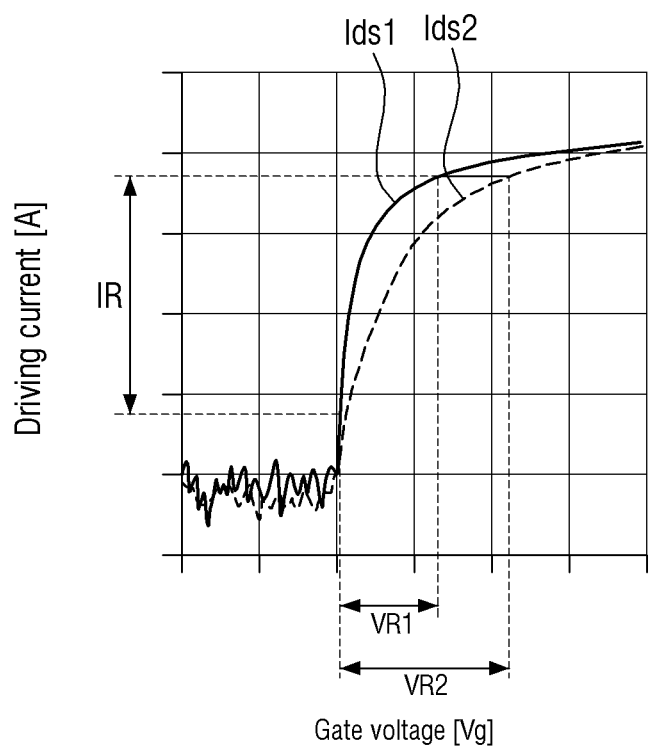
FIG. 10 is a graph illustrating the driving current according to the gate voltage of a driving transistor when the driving transistor includes an active layer doped with a metal and when the driving transistor does not include an active layer doped with a metal.

The metal doped into the first active layer 131 may trap electrons moving through the channel region 131c of the first active layer 131. In this case, due to the metal doped into the first active layer 131, the slope of a driving current (drain-source current Ids) curve according to a gate voltage Vg of the driving transistor DT may be reduced as illustrated in FIG. 10. Accordingly, as illustrated in FIG. 10, when the first active layer 131 is doped with a metal, a range VR2 of the gate voltage Vg of the driving transistor DT within a range IR of a driving current may be wider than a range VR1 of the gate voltage Vg of the driving transistor DT when the first active layer 131 is not doped with a metal. Therefore, even if the driving current of each pixel is reduced as the number of pixels increases in a high-resolution flat panel display device, a reduction in the driving voltage range of the driving transistor DT can be prevented or reduced.

A first gate insulating layer 120 is formed on the first active layer 131 and the second active layer 132. The first gate insulating layer 120 may be an inorganic layer, for example, a silicon oxide ($SiO_x$) layer, a silicon nitride ($SiN_x$) layer, or a multilayered of p these layers.

The first gate electrode 111 and the second gate electrode 112 are formed on the first gate insulating layer 120. The first gate electrode 111 may overlap the first active layer 131 with the first gate insulating layer 120 interposed between them, and the second gate electrode 112 may overlap the second active layer 132 with the first gate insulating layer 120 interposed between them. Specifically, the first gate electrode 111 may overlap the channel region 131c of the first active layer 131, and the second gate electrode 112 may overlap the channel region 132c of the second active layer 132. Each of the first gate electrode 111 and the second gate electrode 112 may be a single layer or a multilayer made of any one or more of molybdenum (Mo), aluminum (Al), chromium (Cr), gold (Au), titanium (Ti), nickel (Ni), neodymium (Ne), copper (Cu), and alloys of these materials.

Although the first gate insulating layer 120 is disposed only between the first gate electrode 111 and the first active layer 131 and between the second gate electrode 112 and the second active layer 132, the inventive concepts are not limited to this case. That is, the first gate insulating layer 120 can be formed on the upper and side surfaces of the first active layer 131 and the second active layer 132.

A first interlayer insulating film 160 is formed on the first gate electrode 111 and the second gate electrode 112. The first interlayer insulating film 160 may be an inorganic layer, for example, a silicon oxide ($SiO_x$) layer, a silicon nitride ($SiN_x$) layer, or a multilayer composed of these layers.

A first contact hole CT1 passing through the first interlayer insulating film 160 to expose a portion of the upper surface of the active layer 131 and a second contact hole CT2 passing through the first interlayer insulating film 160 to expose another portion of the upper surface of the first active layer 131 may be formed in the first interlayer insulating film 160. That is, the first contact hole CT1 may expose the first conducting region 131a of the first active layer 131, and the second contact hole CT2 may expose the second conducting region 131b of the first active layer 131. Also, a third contact hole CT3 passing through the first interlayer insulating film 160 and the buffer layer 102 to expose the first light shielding layer 161 may be formed in the first interlayer insulating film 160 and the buffer layer 102.

In addition, a fourth contact hole CT4 passing through the first interlayer insulating film 160 to expose a portion of the upper surface of the second active layer 132 and a fifth contact hole CT5 passing through the first interlayer insulating film 160 to expose another portion of the upper surface of the second active layer 132 may be formed in the first interlayer insulating film 160. That is, the fourth contact hole CT4 may expose the first conducting region 132a of the second active layer 132, and the fifth contact hole CT5 may expose the second conducting region 132b of the second active layer 132.

The first source electrode 141 and the first drain electrode 151 of the driving transistor DT and the second source electrode 142 and the second drain electrode 152 of the switching transistor ST are formed on the first interlayer insulating film 160.

The first source electrode 141 contacts the first conducting region 131a formed on a side of the first active layer 131 through the first contact hole CT1. The first drain electrode 151 contacts the second conducting region 131b formed on the other side of the first active layer 131 through the second contact hole CT2.

In addition, the first source electrode 141 may contact the first light shielding layer 161 through the third contact hole CT3. In this case, the first light shielding layer 161 disposed under the first active layer 131 and the first source electrode 141 have the same voltage. When the first light shielding layer 161 and the first source electrode 141 have the same electric potential, the first active layer 131 adjacent to the first light shielding layer 161 may not be activated as compared to the first active layer 131 adjacent to the first gate electrode 111. That is, since the electron mobility in the channel region 131c of the first active layer 131 can be reduced, the slope of the driving current (drain-source current Ids) curve according to the gate voltage Vg of the driving transistor DT may be reduced, as illustrated in FIG. 10. Accordingly, as illustrated in FIG. 10, when the first active layer 131 is doped with a metal, the range VR2 of the gate voltage Vg of the driving transistor DT within the range IR of the driving current may be wider than the range VR1 of the gate voltage Vg of the driving transistor DT when the first active layer 131 is not doped with a metal. Therefore, even if the driving current of each pixel is reduced as the number of pixels increases in a high-resolution flat panel display device, a reduction in the driving voltage range of the driving transistor DT can be prevented or reduced.

The second source electrode 142 contacts the first conducting region 132a formed on a side of the second active layer 132 through the fourth contact hole CT4. The second drain electrode 152 contacts the second conducting region 132b formed on the other side of the second active layer 132 through the fifth contact hole CT5.

A first protective layer 170 is formed on the first source electrode 141, the second source electrode 142, the first drain electrode 151, and the second drain electrode 152. The first protective layer 170 may be an inorganic layer, for example, a silicon oxide ($SiO_x$) layer, a silicon nitride ($SIN_x$) layer, or a multilayer composed of these layers.

A first planarization layer 180 may be formed on the first protective layer 170 to flatten steps due to thin-film transistors such as the driving transistor DT and the switching transistor ST. The planarization layer 180 may be made of an organic layer, such as acryl resin, epoxy, resin, phenolic resin, polyamide resin, or polyimide resin.

A light emitting element EL, which includes a first electrode 191, an organic light emitting layer and a second electrode, and a pixel defining layer 195 may be formed on the first planarization layer 180, as shown in FIG. 7.

The first electrode 191 may be formed on the first planarization layer 180. The first electrode 191 may be connected to the first source electrode 141 of the driving transistor DT through a contact hole CNT passing through the first protective layer 170 and the first planarization layer 180.

The pixel defining layer 195 may be formed on the first planarization layer 180 and may cover edges of the first electrode 191 to define pixels. That is, the pixel defining layer 195 serves as a pixel defining layer for defining pixels. Here, each of the pixels is an area in which the first electrode 191, the organic light emitting layer 192, and the second electrode 193 are sequentially stacked so that holes from the first electrode 191 and electrons from the second electrode combine together in the organic light emitting layer to emit light.

The organic light emitting layer 192 may be disposed on the first electrode 191 and the pixel defining layer 195. The organic light emitting layer 192 may include a hole transporting layer, a light emitting layer, and an electron transporting layer. In addition, the organic light emitting layer 192 may be formed in a tandem structure of two stacks or more, in which case a charge generating layer may be formed between the stacks.

The second electrode 193 may be formed on the organic light emitting layer 192. The second electrode 193 may be a common layer common to all pixels.

The light emitting element EL may be of a top emission type which emits light toward a second substrate, that is, in an upward direction. In this case, the first electrode 191 may be made of a metal material having high reflectivity, such as a stack (Ti/Al/Ti) of aluminum (Al) and titanium (Ti), a stack (ITO/Al/ITO) of aluminum (Al) and indium tin oxide (ITO), an APC alloy, or a stack (ITO/APC/ITO) of an APC alloy and ITO. The APC alloy is an alloy of silver (Ag), palladium (Pd), and copper (Cu). In addition, the second electrode 193 may be made of a transparent conductive material (TCO) capable of transmitting light such as ITO or indium zinc oxide (120) or may be made of a semi-transmissive conductive material such as magnesium (Mg), silver (Ag) or an alloy of magnesium (Mg) and silver (Ag). When the second electrode 193 is made of a semi-transmissive conductive material, the light emission efficiency may be increased by micro-cavities.

An encapsulation layer 196 may be formed on the second electrode 193 to prevent introduction of oxygen or moisture. The encapsulation layer 196 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the encapsulation layer 196 may include at least one organic layer to prevent particles from penetrating the encapsulation layer and entering the organic light layer and the second electrode. The organic layer may be made of epoxy, acrylate, or urethane acrylate.

A pull-up transistor TU, a pull-down transistor TD, and transistors of a node controller NC of a scan driver circuit SDC may each include a third gate electrode, a third active layer, a third source electrode, and a third drain electrode. Each of the pull-up transistor TU, the pull-down transistor TD, and the transistors of the node controller NC of the scan driver circuit SDC may be formed substantially the same as the switching transistor ST illustrated in FIGS. 8 and 9. In this case, the third gate electrode, the third active layer, the third source electrode, and the third drain electrode of each of the pull-up transistor TU, the pull-down transistor TD, and the transistors of the node controller NC of the scan driver circuit SDC are substantially the same as the second gate electrode 112, the second active layer 132, the second source electrode 142, and the second drain electrode 152 of the switching transistor ST described above with reference to FIGS. 8 and 9, and thus a detailed description thereof is omitted.

In addition, first distribution transistors MT1 and second distribution transistors MT2 of a data voltage distribution circuit DMUX may each include a fourth gate electrode, a fourth active layer, a fourth source electrode, and a fourth drain electrode. Each of the first distribution transistors MT1 and the second distribution transistors MT2 of the data voltage distribution circuit DMUX may be formed substantially the same as the switching transistor ST illustrated in FIGS. 8 and 9. In this case, the fourth gate electrode, the fourth active layer, the fourth source electrode, and the fourth drain electrode of each of the first distribution transistors MT1 and the second distribution transistors MT2 of the data voltage distribution circuit DMUX are substantially the same as the second gate electrode 112, the second active layer 132, the second source electrode 142, and the second drain electrode 152 of the switching transistor ST described above with reference to FIGS. 8 and 9, and thus, a detailed description thereof is omitted.

Figure 11:
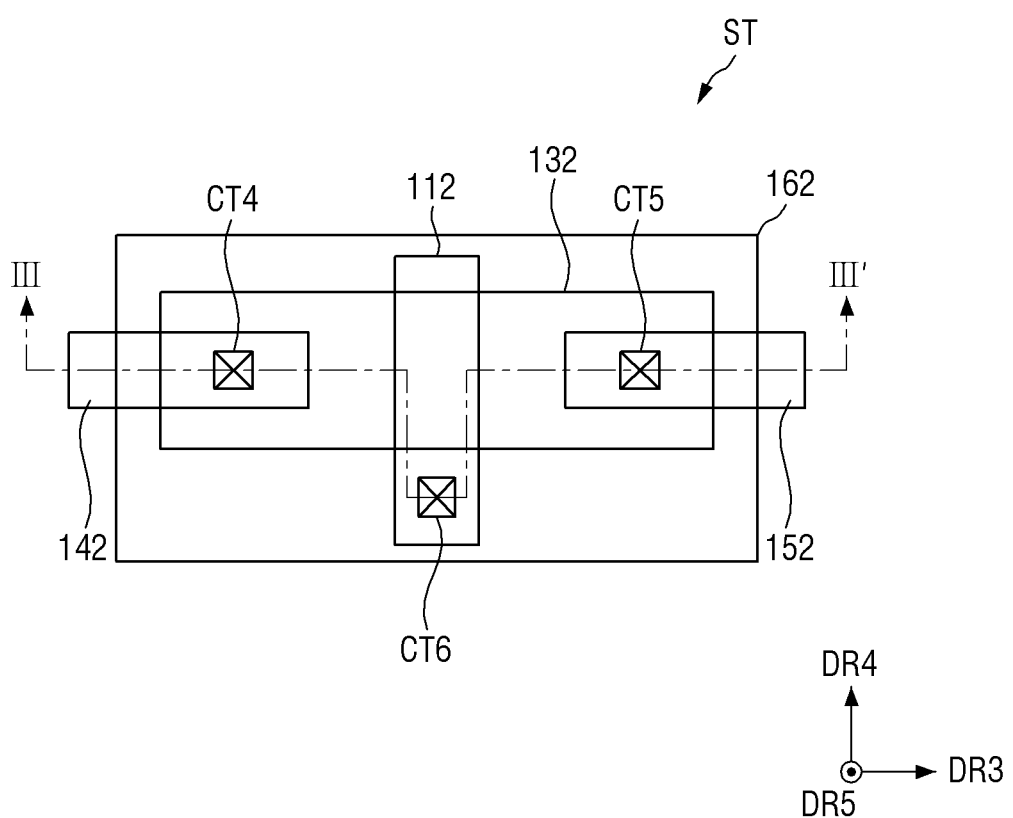
FIG. 11 is a plan view of an example of the switching transistor of the pixel illustrated in FIG. 3.
Figure 12:
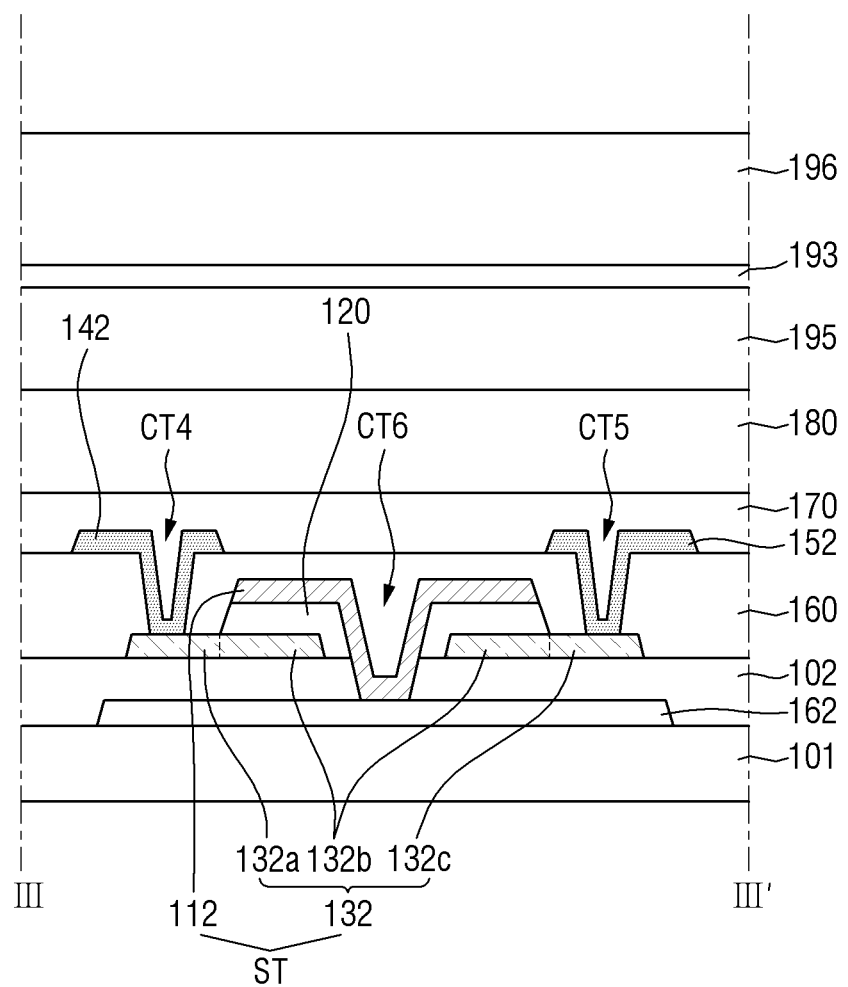
FIG. 12 is an example cross-sectional view taken along of FIG. 11.

FIG. 11 is a plan view of an example of the switching transistor ST of the pixel P illustrated in FIG. 3. FIG. 12 is an example cross-sectional view taken along of FIG. 11.

The exemplary embodiment of FIGS. 11 and 12 is different from the exemplary embodiment of FIGS. 8 and 9 in that a second gate electrode 112 of a switching transistor ST is connected to a second light shielding layer 162. In FIGS. 11 and 12, a redundant description of the same elements and features as those of the embodiment of FIGS. 8 and 9 will be omitted, and differences from the exemplary embodiments of FIGS. 8 and 9 will be mainly described.

Referring to FIGS. 11 and 12, the switching transistor ST may include the second light shielding layer 162 in addition to the second gate electrode 112, a second active layer 132, a second source electrode 142, and a second drain electrode 152.

To block external light from entering the second active layer 132 through a first substrate 101, the second light shielding layer 162 may be formed on the first substrate 101. Lengths of the second light shielding layer 162 in the fourth direction DR4 and the fifth direction DR5 may be greater than lengths of the second active layer 132 in the fourth direction DR4 and the fifth direction DR5. The second light shielding layer 162 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials. A buffer layer 102 may be formed on the second light shielding layer 162.

The second gate electrode 112 may contact the second light shielding layer 162 through a sixth contact hole CT6. The sixth contact hole CT6 may pass through a first gate insulating layer 120 and the buffer layer 102 to expose the second light shielding layer 162. In this case, the second light shielding layer 162 disposed under the second active layer 132 and the second gate electrode 112 have the same voltage. That is, the second gate electrode 112 may serve as a top gate electrode, and the second light shielding layer 162 may serve as a bottom gate electrode. Therefore, since the switching transistor ST can be driven in a double-gate manner, it is possible to prevent or reduce the flowing of a leakage current through a channel region 132c of the second active layer 132 when the switching transistor ST is turned off.

Each of a pull-up transistor TU, a pull-down transistor TD, and transistors of a node controller NC of a scan driver circuit SDC may be formed substantially the same as the switching transistor ST illustrated in FIGS. 11 and 12. In this case, a third gate electrode, a third active layer, a third source electrode and a third drain electrode of each of the pull-up transistor TU, the pull-down transistor TD and the transistors of the node controller NC of the scan driver circuit SDC are substantially the same as the second gate electrode 112, the second active layer 132, the second source electrode 142 and the second drain electrode 152 of the switching transistor ST described above with reference to FIGS. 11 and 12, and thus, a detailed description thereof is omitted.

In addition, each of first distribution transistors MT1 and second distribution transistors MT2 of a data voltage distribution circuit DMUX may be formed substantially the same as the switching transistor ST illustrated in FIGS. 11 and 12. In this case, a fourth gate electrode, a fourth active layer, a fourth source electrode, and a fourth drain electrode of each of the first distribution transistors MT1 and the second distribution transistors MT2 of the data voltage distribution circuit DMUX are substantially the same as the second gate electrode 112, the second active layer 132, the second source electrode 142, and the second drain electrode 152 of the switching transistor ST described above with reference to FIGS. 11 and 12, and thus a detailed description thereof is omitted.

Figure 13:
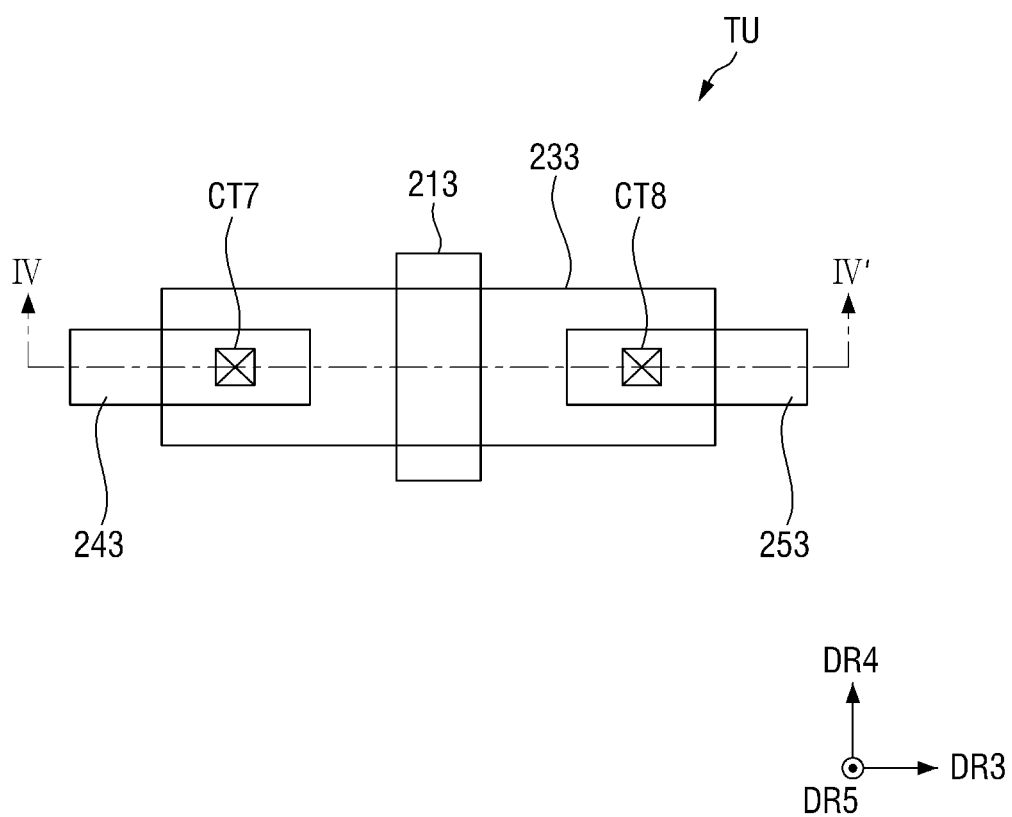
FIG. 13 is a plan view of an example of a pull-up transistor of the scan driver circuit illustrated in FIG. 4.
Figure 14:
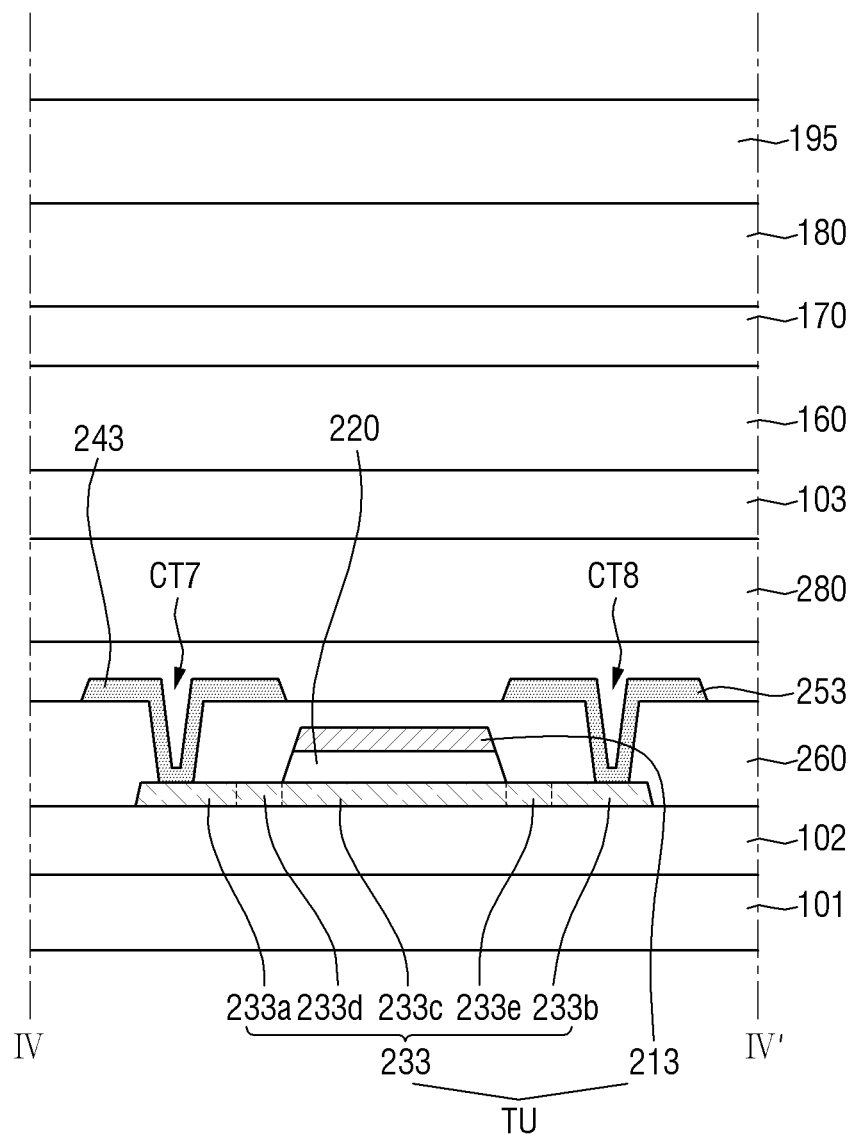
FIG. 14 is an example cross-sectional view taken along IV-IV' of FIG. 13.

FIG. 13 is a plan view of an example of the pull-up transistor TU of the scan driver circuit SDC illustrated in FIG. 4. FIG. 14 is an example cross-sectional view taken along IV-IV' of FIG. 13.

The exemplary embodiment of FIGS. 13 and 14 is different from the exemplary embodiment of FIGS. 6 through 9 in that a third active layer 233 of a pull-up transistor TU of a scan driver circuit SDC includes polysilicon, and thus, a driving transistor DT and a switching transistor ST of a pixel P are formed on a higher layer than the pull-up transistor TU of the scan driver circuit SDC. In FIGS. 13 and 14, a redundant description of the same elements and features as those of the embodiment of FIGS. 6 through 9 will be omitted, and differences from the embodiment of FIGS. 6 through 9 will be mainly described.

Referring to FIGS. 13 and 14, the pull-up transistor TU of the scan driver circuit SDC includes a third gate electrode 213, the third active layer 233, a third source electrode 243, and a third drain electrode 253.

The third active layer 233 including polysilicon may be formed on a buffer layer 102. The third active layer 233 may include a first heavily doped region 233a, a second heavily doped region 233b, a channel region 233c, a first lightly doped region 233d, and a second lightly doped region 233e. The channel region 233c may be made of polysilicon not doped with impurities, the first heavily doped region 233a and the second heavily doped region 233b may be made of polysilicon heavily doped with impurities, and the first lightly doped region 233d and the second lightly doped region 233e may be made of polysilicon lightly doped with impurities.

A second gate insulating layer 220 is formed on the third active layer 233. The second gate insulating layer 220 may be an inorganic layer, for example, a silicon oxide (SiO$_x$) layer, a silicon nitride (SiN$_x$) layer, or a multi layer composed of these layers.

The third gate electrode 213 is formed on the second gate insulating layer 220. The third gate electrode 213 may overlap the third active layer 233 with the second gate insulating layer 220 interposed between them. Specifically, the third gate electrode 213 may overlap the channel region 233c of the third active layer 233. The third gate electrode 213 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials.

Although the second gate insulating layer 220 is disposed between the third gate electrode 213 and the third active layer 233 in FIG. 14, embodiments are not limited to this case. That is, the second gate insulating layer 220 may also be formed on upper and side surfaces of the third active layer 233.

A second interlayer insulating film 260 is formed on the third gate electrode 213. The second interlayer insulating film 260 may be an inorganic layer, for example, a silicon oxide (SiO$_x$) layer, a silicon nitride (SiN$_x$) layer, or a multilayer composed of these layers.

A seventh contact hole CT7 passing through the second interlayer insulating film 260 to expose a portion of the upper surface of the second active layer 233 and an eighth contact hole CT8 passing through the second interlayer insulating film 260 to expose another portion of the upper surface of the third active layer 233 may be formed in the second interlayer insulating film 260. That is, the seventh contact hole CT7 may expose the first heavily doped region 233a of the third active layer 233, and the eighth contact hole CT8 may expose the second heavily doped region 233b of the third active layer 233.

The third source electrode 243 and the third drain electrode 253 of the pull-up transistor TU are formed on the second interlayer insulating film 260. The third source electrode 243 contacts the first heavily doped region 233a formed on a side of the third active layer 233 through the seventh contact hole CT7. The third drain electrode 253 contacts the second heavily doped region 233b formed on the other side of the third active layer 233 through the eighth contact hole CT8.

A second protective layer 270 is formed on the third source electrode 243 and the third drain electrode 253. The second protective layer 270 may be an inorganic layer, for example, a silicon oxide (SiO$_x$) layer, a silicon itride (SiN$_x$) layer, or a multilayered of p these layers.

A second planarization layer 280 may be formed on the second protective layer 270 to flatten steps due to thin-film transistors such as the pull-up transistor TU. The second planarization layer 280 may be made of an organic layer, such as acryl resin, epoxy resin, phenolic resin, polyamide resin, or polyimide resin.

Each of a pull-down transistor TD and transistors of a node controller NC of the scan driver circuit SDC may be formed substantially the same as the pull-up transistor TU illustrated in FIGS. 13 and 14.

In addition, first distribution transistors MT1 and second distribution transistors MT2 of a data voltage distribution circuit DMUX may each include a fourth gate electrode, a fourth active layer, a fourth source electrode, and a fourth drain electrode. Each of the first distribution transistors MT1 and the second distribution transistors MT2 of the data voltage distribution circuit DMUX may be formed substantially the same as the pull-up transistor TU of the scan driver circuit SDC illustrated in FIGS. 13 and 14. In this case, the fourth gate electrode, the fourth active layer, the fourth source electrode, and the fourth drain electrode of each of the first distribution transistors MT1 and the second distribution transistors MT2 of the data voltage distribution circuit DMUX are substantially the same as the third gate electrode 213, the third active layer 233, the third source electrode 243 and the third drain electrode 253 of the pull-up transistor TU described above with reference to FIGS. 13 and 14, and thus, a detailed description thereof is omitted.

An insulating layer 103 may be formed on the second planarization layer 280, instead of the buffer layer 102 described with reference to FIGS. 6 through 9. In addition, the first interlayer insulating film 160, the first protective layer 170, and the first planarization layer 180 described with reference to FIGS. 6 through 9 may be formed on the insulating layer 160. That is, a first thin-film transistor layer TFT1 including the pull-up transistor TU, the pull-down transistor TD and the transistors of the node controller NC of the scan driver circuit SDC and the first distribution transistors MT1 and the second distribution transistors MT2 of the data voltage distribution circuit DMUX may be formed on the first substrate 101 in the exemplary embodiment of FIGS. 13 and 14. A second thin-film transistor layer TFT2 including the driving transistor DT and the switching transistor ST of each pixel P may be formed on the first thin-film transistor layer TFT1. Then, light emitting elements EL, each including a first electrode 191, an organic light emitting layer and a second electrode, may be formed on the second thin-film transistor layer TFT2.

Figure 15:
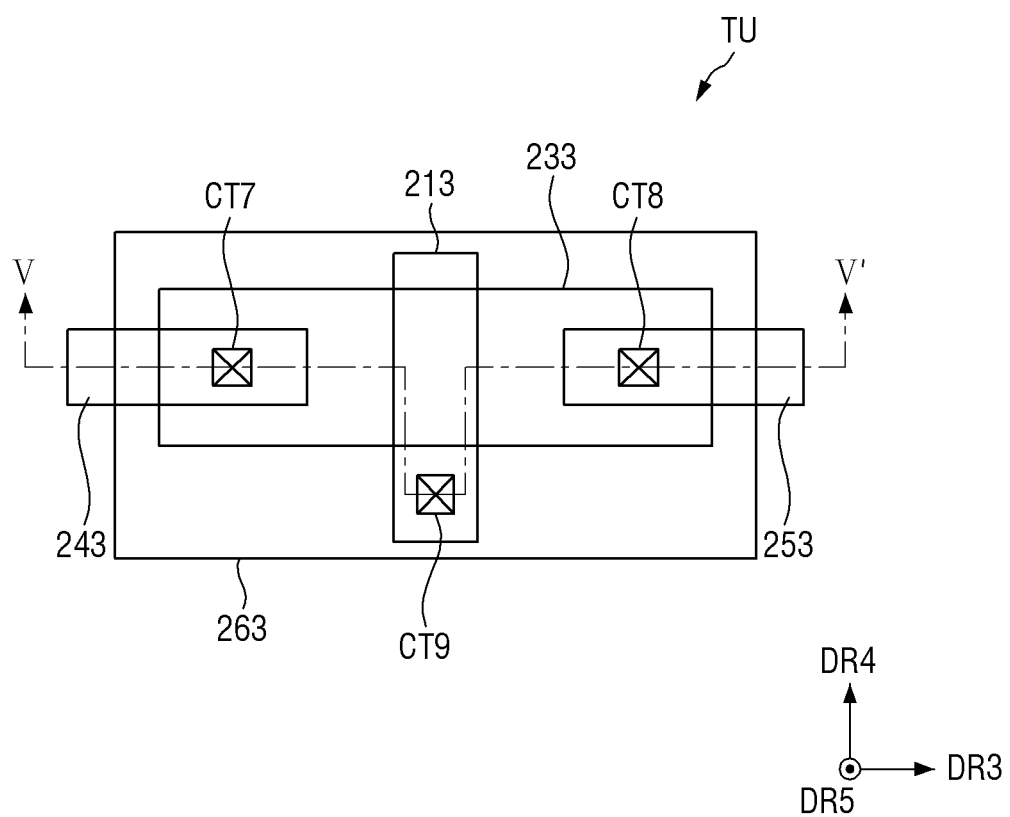
FIG. 15 is a plan view of an example of the pull-up transistor of the scan driver circuit illustrated in FIG. 4.
Figure 16:
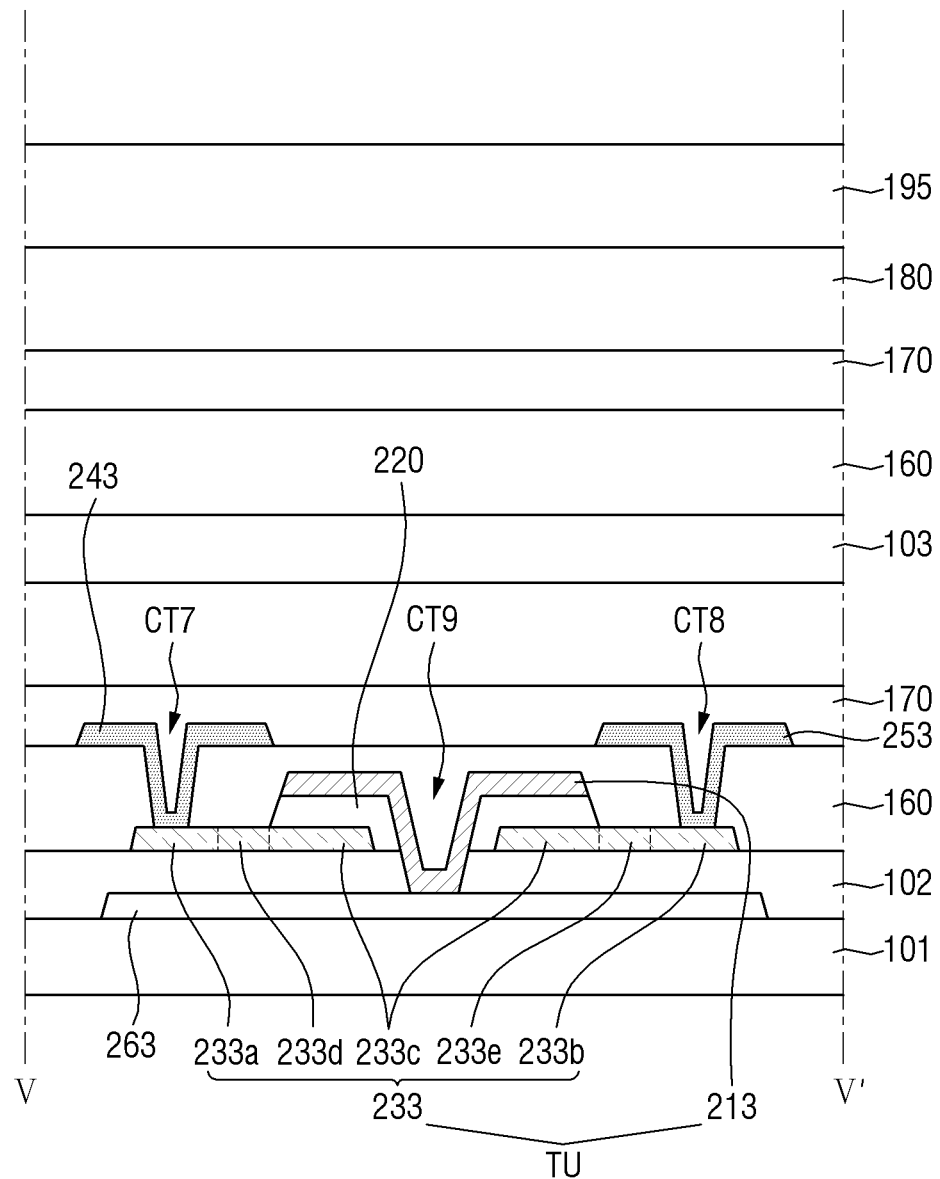
FIG. 16 is an example cross-sectional view taken along V-V' of FIG. 15.

FIG. 15 is a plan view of an example of the pull-up transistor TU of the scan driver circuit SDC illustrated in FIG. 4. FIG. 16 is an example cross-sectional view taken along V-V' of FIG. 15.

The exemplary embodiment of FIGS. 15 and 16 is different from the exemplary embodiment of FIGS. 13 and 14 in that a third gate electrode 213 of a pull-up transistor TU is connected to a third light shielding layer 263. In FIGS. 15 and 16, a redundant description of the same elements and features as those of the exemplary embodiment of FIGS. 13 and 14 will be omitted, and differences from the embodiment of FIGS. 13 and 14 will be mainly described.

Referring to FIGS. 15 and 16, the pull-up transistor TU of a scan driver circuit SDC includes the third light shielding layer 263 in addition to the third gate electrode 213, a third active layer 233, a third source electrode 243, and a third drain electrode 253.

To block external light from entering the third active layer 233 through a first substrate 101, the third light shielding layer 263 may be formed on the first substrate 101. Lengths of the third light shielding layer 263 in the fourth direction DR4 and the fifth direction DR5 may be greater than lengths of the third active layer 233 in the fourth direction DR4 and the fifth direction DR5. The third light shielding layer 263 may be a single layer or a multilayer made of any one or ore of molybdenum (Mo), aluminum (Al), chromium (Cr), gold (Au), titanium (Ti), nickel (Ni), neodymium (Nd), copper (Cu), and alloys of these materials. A buffer layer 102 may be formed on the third light shielding layer 263.

The third gate electrode 213 may contact the third light shielding layer 263 through a ninth contact hole CT9. The ninth contact hole CT9 may pass through a second gate insulating layer 220 and the buffer layer 102 to expose the third light shielding layer 263. In this case, the third light shielding layer 263 disposed under the third active layer 233 and the third gate electrode 213 have the same voltage. That is, the third gate electrode 213 may serve as a top gate electrode, and the third light shielding layer 263 may serve as a bottom gate electrode. Therefore, since the pull-up transistor TU can be driven in a double-gate manner, it is possible to prevent or reduce the flowing of a leakage current through a channel region 233c of the third active layer 233 of the pull-up transistor TU when the pull-up transistor TU is turned off.

Each of a pull-down transistor TD and transistors of a node controller NC of the scan driver circuit SDC may be formed substantially the same as the pull-up transistor TU illustrated in FIGS. 15 and 16.

In addition, first distribution transistors MT1 and second distribution transistors MT2 of a data voltage distribution circuit DMUX may each include a fourth gate electrode, a fourth active layer, a fourth source electrode, and a fourth drain electrode. Each of the first distribution transistors MT1 and the second distribution transistors MT2 of the data voltage distribution circuit DMUX may be formed substantially the same as the pull-up transistor TU of the scan driver circuit SDC illustrated in FIGS. 15 and 16. In this case, the fourth gate electrode, the fourth active layer, the fourth source electrode, and the fourth drain electrode of each of the first distribution transistors MT1 and the second distribution transistors MT2 of the data voltage distribution circuit DMUX are substantially the same as the third gate electrode 213, the third active layer 233, the third source electrode 243, and the third drain electrode 253 of the pull-up transistor TU described above with reference to FIGS. 15 and 16, and thus, a detailed description thereof is omitted.

Figure 17:
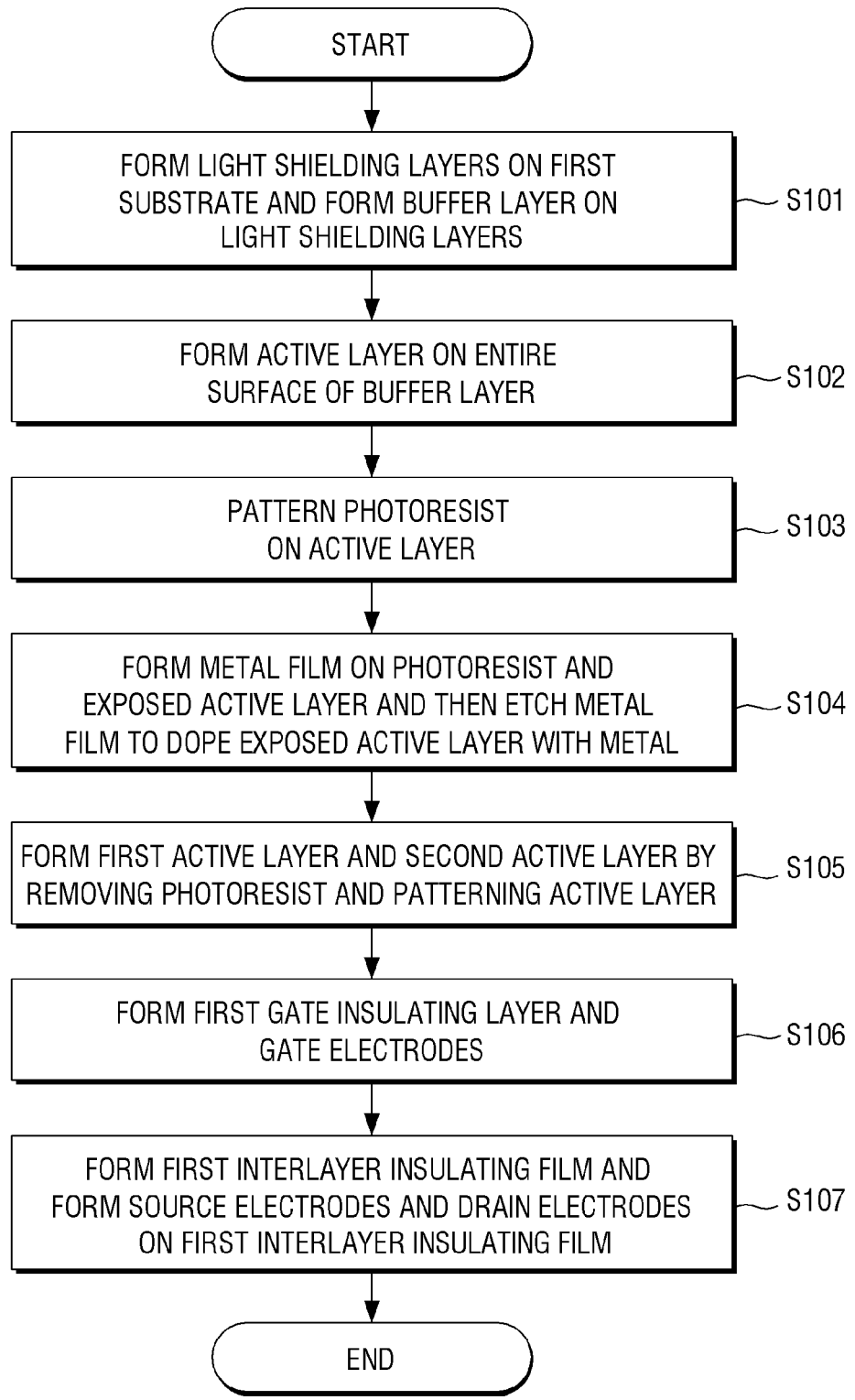
FIG. 17 is a flowchart illustrating a method of manufacturing a display device according to an exemplary embodiment.

FIG. 17 is a flowchart illustrating a method of manufacturing a display device according to an exemplary embodiment. FIGS. 18A through 18G are cross-sectional views for explaining the method of manufacturing a display device according to the exemplary embodiment.

The method of manufacturing a display device according to the embodiment will now be described in detail with reference to FIGS. 17 and 18A through 18G. Each of FIGS. 18A through 18G includes a cross section taken along I-I' of FIG. 6 and a cross section taken along of FIG. 11.

Figure 18A:
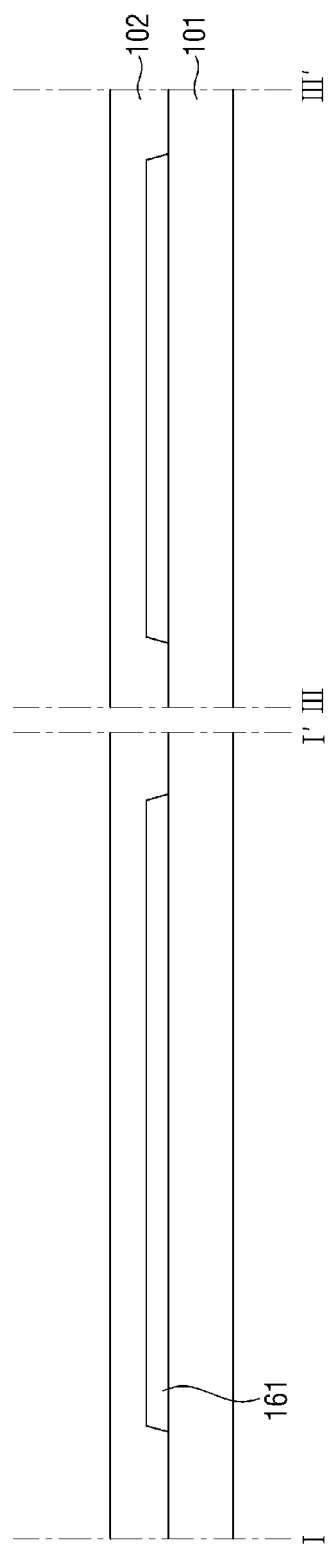

First, referring to FIG. 18A, a first light shielding layer 161 and a second light shielding layer 162 are formed on a first substrate 101, and a buffer layer 102 is formed on the first light shielding layer 161 and the second light shielding layer 162 (operation S101 in FIG. 17).

The first light shielding layer 161 is a layer for preventing light from the first substrate 101 from entering a first active layer 131, and the second light shielding layer 162 is a layer for preventing light from the first substrate 101 from entering the first active layer 131. Each of the first light shielding layer 161 and the second light shielding layer 162 may be a single layer or a layer made of any one or more of molybdenum (Mo), aluminum (Al), chromium (Cr), gold (Au), titanium (Ti), nickel (Ni), neodymium (Nd), copper (Cu), and alloys of these materials. The first light shielding layer 161 and the second light shielding layer 162 may be formed by patterning a light shielding metal layer, which is formed on the entire surface of the first substrate 101 by sputtering, in an etching process using a photoresist pattern.

The buffer layer 102 is formed on the first light shielding layer 161 and the second light shielding layer 162. The buffer layer 102 is a layer for protecting a driving transistor DT and a switching transistor ST of each pixel P from moisture introduced through the first substrate 101. The buffer layer 102 may be composed of a plurality of inorganic layers stacked alternately. For example, the buffer layer 102 may be a multilayer in which one or more inorganic layers selected from a silicon oxide ($SiO_x$) layer, a silicon nitride ($SiN_x$) layer, and SiON are alternately stacked. The buffer layer 102 may be formed by chemical vapor deposition.

Figure 18B:
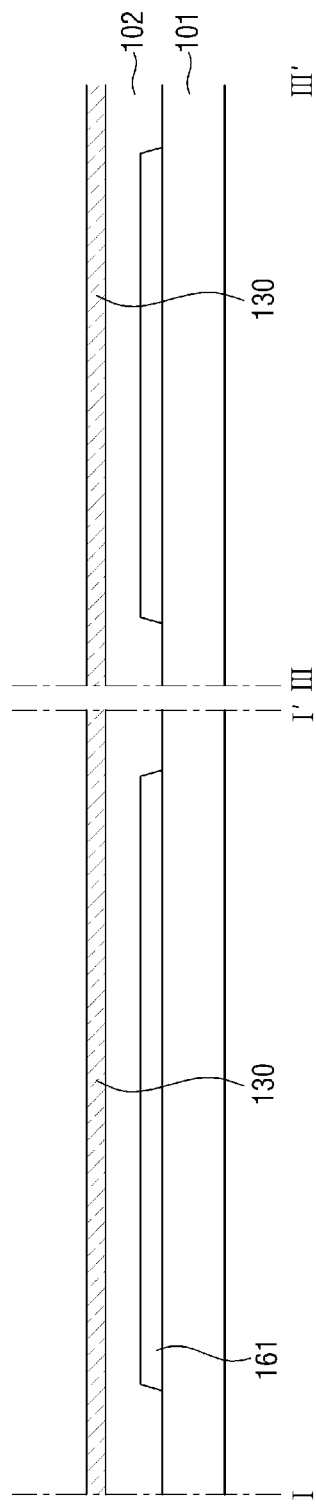

Second, referring to FIG. 18B, an active layer 130 is formed on the entire surface of the buffer layer 102 (operation S102 in FIG. 17).

The active layer 130 may be an oxide semiconductor. For example, the active layer 130 may be an oxide semiconductor containing tin (Sn). In this case, the active layer 130 may be indium-gallium-tin oxide (IGTO) or indium-gallium-zinc-tin oxide (IGZTO). The active layer 130 may be formed by sputtering.

Figure 18C:
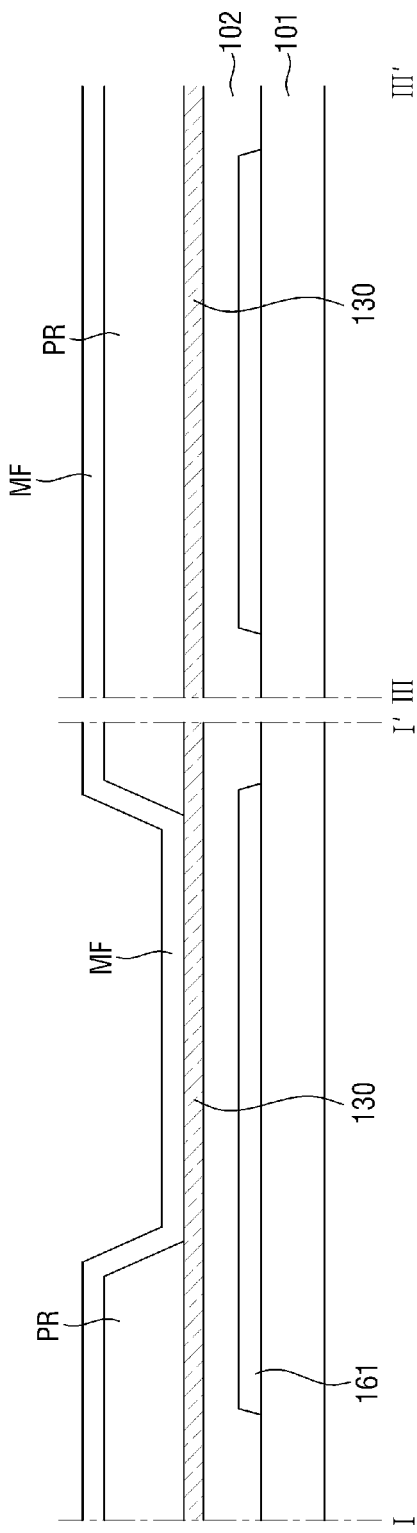
Figure 18D:
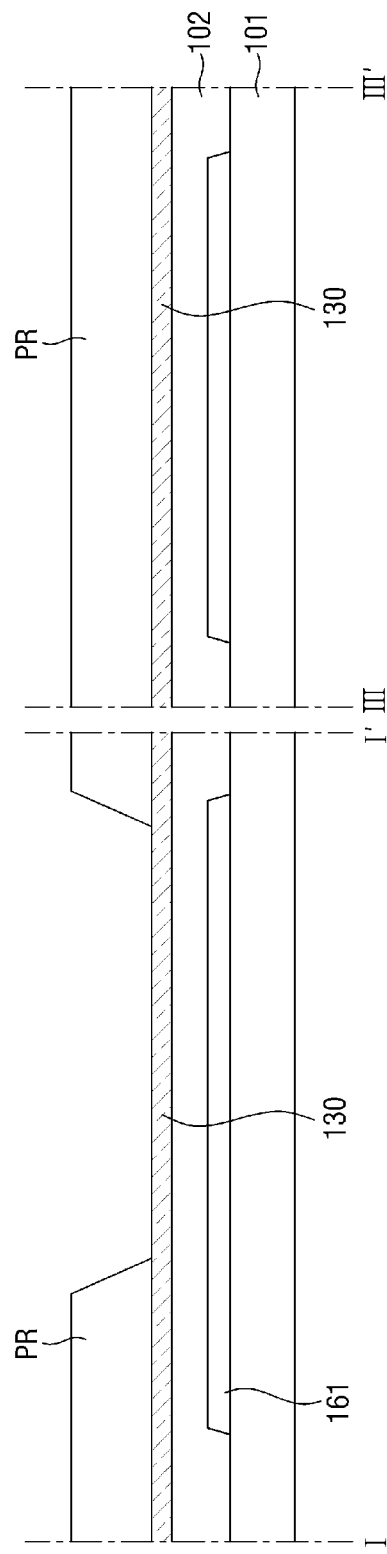

Third, referring to FIG. 18C, a photoresist PR is patterned on the active layer 130 (operation S103 in FIG. 17).

The photoresist PR may be formed on the active layer 130 excluding an area where a first active layer 131 is to be formed. Alternatively, the photoresist PR may be formed on an area of the active layer 130 where a second active layer 132 is to be formed.

Fourth, referring to FIG. 18C, a metal film MF is formed on the photoresist PR and the exposed active layer 130. Then, referring to FIG. 18D, the metal film MF is etched to dope the exposed active layer 130 with a metal (operation S104 in FIG. 17).

The metal film MF may be copper (Cu), arsenic (As), antimony (Sb), lanthanum (La), a mixture of silver (Ag) and nitrogen (N), a mixture of boron (B) and nitrogen (N), or a mixture of gallium (Ga) and nitrogen (N). The metal film MF may be formed by sputtering.

To prevent the active layer 130 from being damaged by an etchant used to etch the metal film MF, the etchant used to etch the metal film MF may be a solution that reacts only with the metal film MF and does not react with the active layer 130. For example, if the metal film MF is copper (Cu) and the first active layer 131 is an oxide semiconductor containing tin (Sn), the etchant may be a non-hydrogen peroxide solution including citric acid or ammonium persulfate to react with copper (Cu) and not react with the first active layer 131. The metal film MF may be etched by wet etching.

Fifth, referring to FIG. 18E, the first active layer 131 and the second active layer 132 are formed by removing the photoresist PR and patterning the photoresist PR (operation S105 in FIG. 17).

The photoresist PR may be removed by a strip process. The first active layer 131 and the second active layer 132 may be formed by patterning the active layer 130 in an etching process using a photoresist pattern different from the photoresist PR. The active layer 130 may be patterned by wet etching or dry etching.

The metal doped into the first active layer 131 may be formed only on an upper surface of the first active layer 131. In addition, the proportion of the metal doped into the first active layer 131 in the first active layer 131 may be about 10 atomic % or less.

Figure 18F:
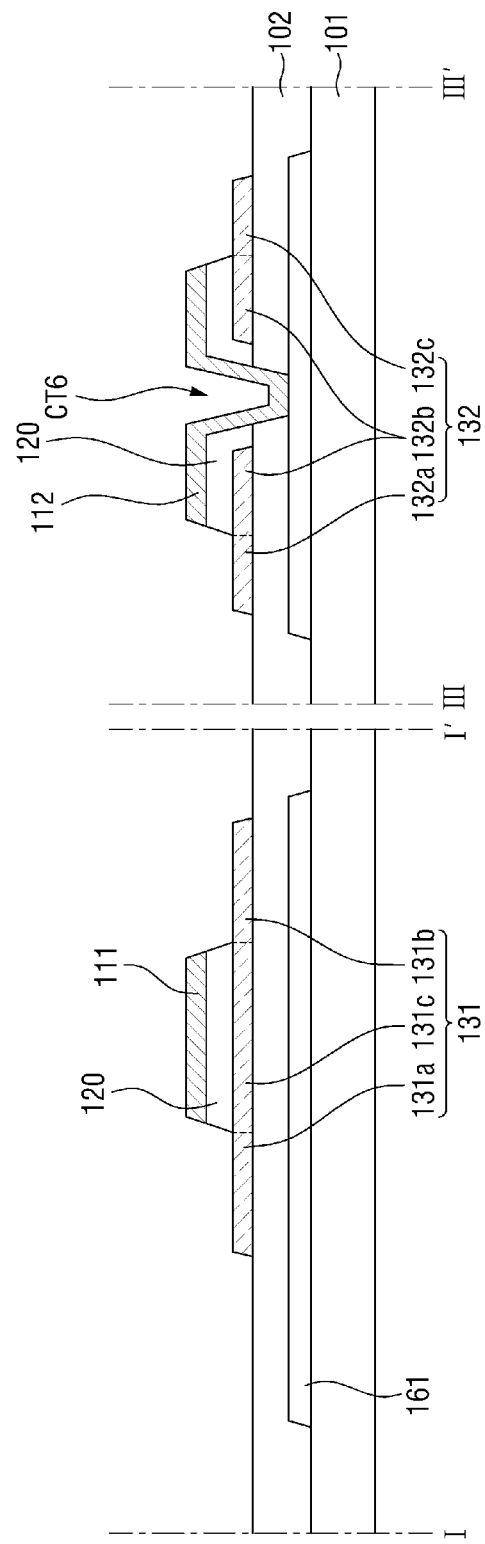

Sixth, referring to FIG. 18F, a first gate insulating layer 120 is formed on the first active layer 131 and the second active layer 132, and a first gate electrode 111, and a second gate electrode 112 are formed on the first gate insulating layer 120 (operation S106 in FIG. 17).

The first gate insulating layer 120 may be an inorganic layer, for example, a silicon oxide ($SiO_x$) layer, a silicon nitride ($SiN_x$) layer, or a multilayer composed of these layers. The first gate insulating layer 120 may be formed by chemical vapor deposition.

Each of the first gate electrode 111 and the second gate electrode 112 may be a single layer or a multilayer made of any one or more of molybdenum (Mo), aluminum (Al), chromium (Cr), gold (Au), titanium (Ti), nickel (Ni), neodymium (Ne), copper (Cu), and alloys of these materials. The first gate electrode 111 and the second gate electrode 112 may be formed by patterning a gate metal layer, which is formed on the entire surface of the first gate insulating layer 120 by sputtering, in an etching process using a photoresist pattern.

Figure 18G:
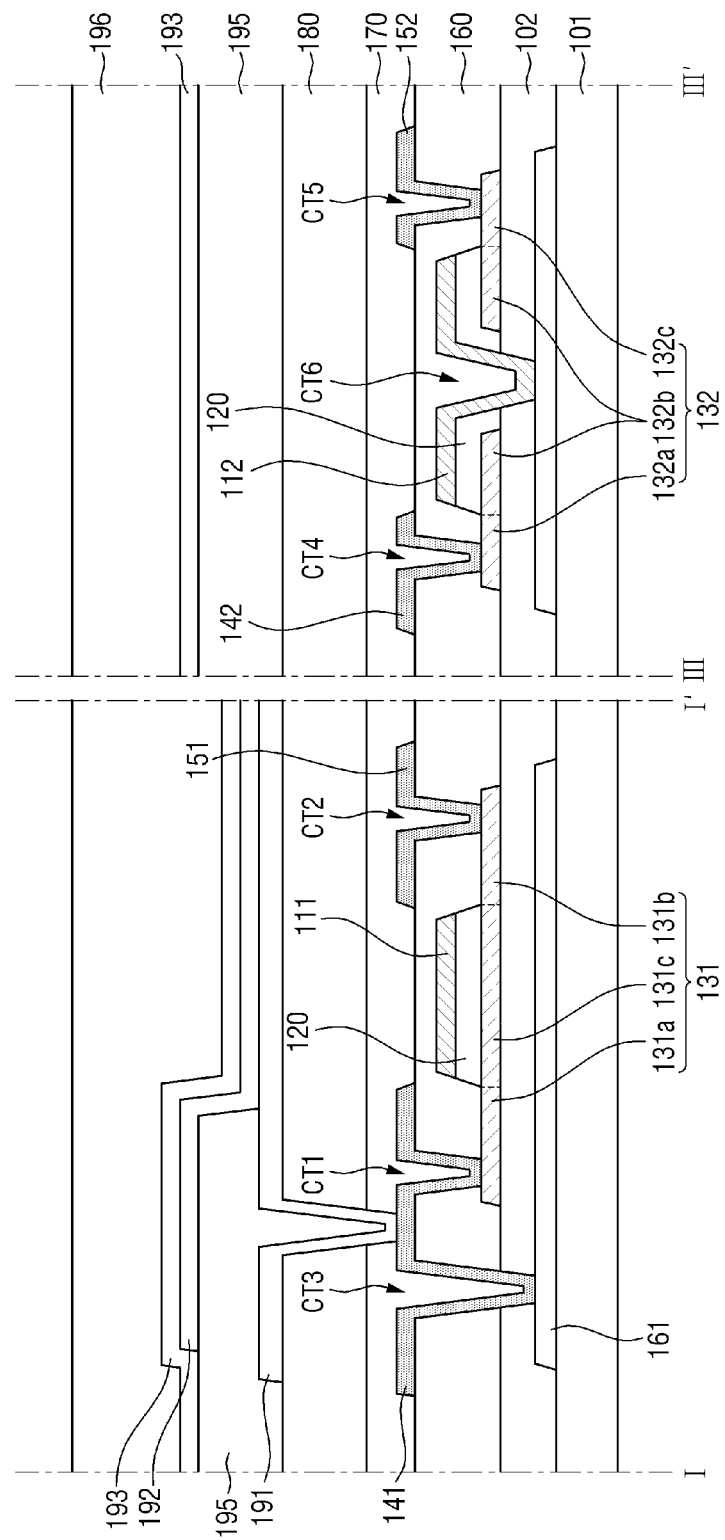

The first gate insulating layer 120 may be etched and patterned as in FIG. 18G by using the first gate electrode Iliad the second gate electrode 112 as a mask. The upper surface of the first active layer 131 and an upper surface of the second active layer 132 which are not covered by the first gate insulating layer 120 may be made conductive by a batch etching process of the first gate electrode 111, the second gate electrode 112, and the first gate insulating layer 120.

Seventh, referring to FIG. 18G, a first interlayer insulating film 160 is formed on the first gate electrode 111 and the second gate electrode 112, and a first source electrode 141, a second source electrode 142, a first drain electrode 151 and a second drain electrode 152 are formed on the first interlayer insulating film 160 (operation S107 in FIG. 17).

The first interlayer insulating film 160 may be an inorganic layer, for example, a silicon oxide ($SiO_x$) layer, a silicon nitride ($SiN_x$) layer, or a multilayer composed of these layers. The first interlayer insulating film 160 may be formed by chemical vapor deposition.

A first contact hole CT1 passing through the first interlayer insulating film 160 to expose a portion of the upper surface of the first active layer 131 and a second contact hole CT2 passing through the first interlayer insulating film 160 to expose another portion of the upper surface of the first active layer 131 may be formed in the first interlayer insulating film 160. A third contact hole CT3 passing through the first interlayer insulating film 160 and the buffer layer 102 to expose the first light shielding layer 161 may be formed in the first interlayer insulating film 160 and the buffer layer 102.

In addition, a fourth contact hole CT4 passing through the first interlayer insulating film 160 to expose a portion of the upper surface of the second active layer 132 and a fifth contact hole CT5 passing through the first interlayer insulating film 160 to expose another portion of the upper surface of the second active layer 132 may be formed in the first interlayer insulating film 160. A sixth contact hole CT6 passing through the first interlayer insulating film 160 and the buffer layer 102 to expose the second light shielding layer 162 may be formed in the first interlayer insulating film 160 and the buffer layer 102.

Each of the first source electrode 141, the second source electrode 142, the first drain electrode 151, and the second drain electrode 152 may be a single layer or a multilayer made of any one or more of molybdenum (Mo), aluminum (Al), chromium (Cr), gold (Au), titanium (Ti), nickel (Ni), neodymium (Ne), copper (Cu), and alloys of these materials. The first source electrode 141, the second source electrode 142, the first drain electrode 151, and the second drain electrode 152 may be formed by patterning a source drain metal layer, which is formed on the entire surface of the first interlayer insulating film 160 by sputtering, in an etching process using a photoresist pattern.

The first source electrode 141 may be formed to contact a first conducting region 131a formed on a side of the first active layer 131 through the first contact hole CT1. The first drain electrode 151 may be formed to contact a second conducting region 131b formed on the other side of the first active layer 131 through the second contact hole CT2. In addition, the first source electrode 141 may be formed to contact the first light shielding layer 161 through the third contact hole CT3.

The second source electrode 142 may be formed to contact a first conducting region 132a formed on a side of the second active layer 132 through the fourth contact hole CT4. The second drain electrode 152 may be formed to contact a second conducting region 132b formed on the other side of the second active layer 132 through the fifth contact hole CT5. In addition, the second source electrode 142 may be formed to contact the second light shielding layer 162 through the sixth contact hole CT6.

A first protective layer 170 is formed on the first source electrode 141, the second source electrode 142, the first drain electrode 151, and the second drain electrode 152. The first protective layer 170 may be an inorganic layer, for example, a silicon oxide ($SiO_x$) layer, a silicon nitride (SiN) layer, or a multilayer composed of these layers. The first protective layer 170 may be formed by chemical vapor deposition.

A first planarization layer 180 may be formed on the protective layer 170 to flatten steps due to thin-film transistors such as the driving transistor DT and the switching transistor ST. The first planarization layer 180 may be made of an organic layer, such as acryl resin, epoxy resin, phenolic resin, polyamide resin, or polyimide resin.

A third gate electrode, a third active layer, a third source electrode, and a third drain electrode of each of a pull-up transistor TU, a pull-down transistor TD, and a plurality of transistors of a node controller NC of a scan driver circuit SDC may be formed substantially the same as the second gate electrode 112, the second active layer 132, the second source electrode 142, and the second drain electrode 152 of the switching transistor ST described above with reference to FIGS. 17, 18A, and 18G, and thus a detailed description thereof is omitted.

In addition, each of first distribution transistors MT1 and second distribution transistors MT2 of a data voltage distribution circuit DMUX may be formed substantially the same as the switching transistor ST described above with reference to FIGS. 17 and 18A through 18G, and thus, a detailed description thereof is omitted.

Figure 19:
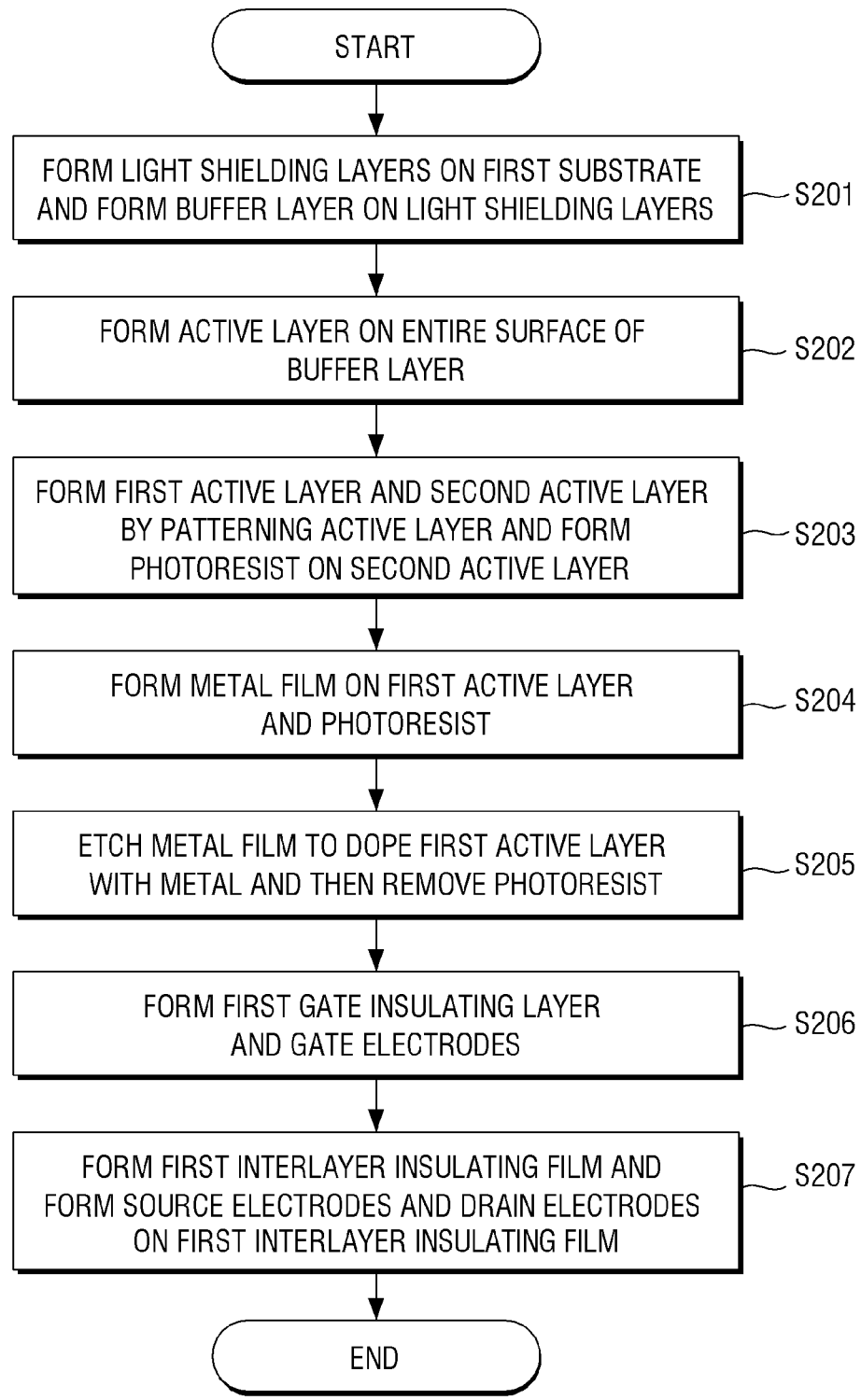
FIG. 19 is a flowchart illustrating a method of manufacturing a display device according to an exemplary embodiment.
Figure 20A:
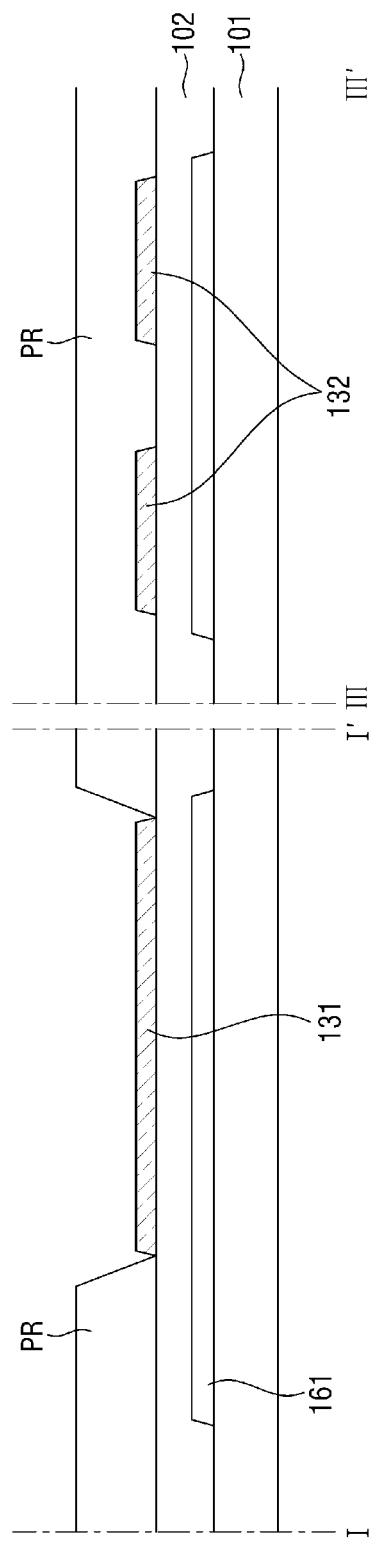
FIGS. 20A, 20B, and 20C are cross-sectional views for explaining the method of manufacturing a display device according to an exemplary embodiment.
Figure 20B:
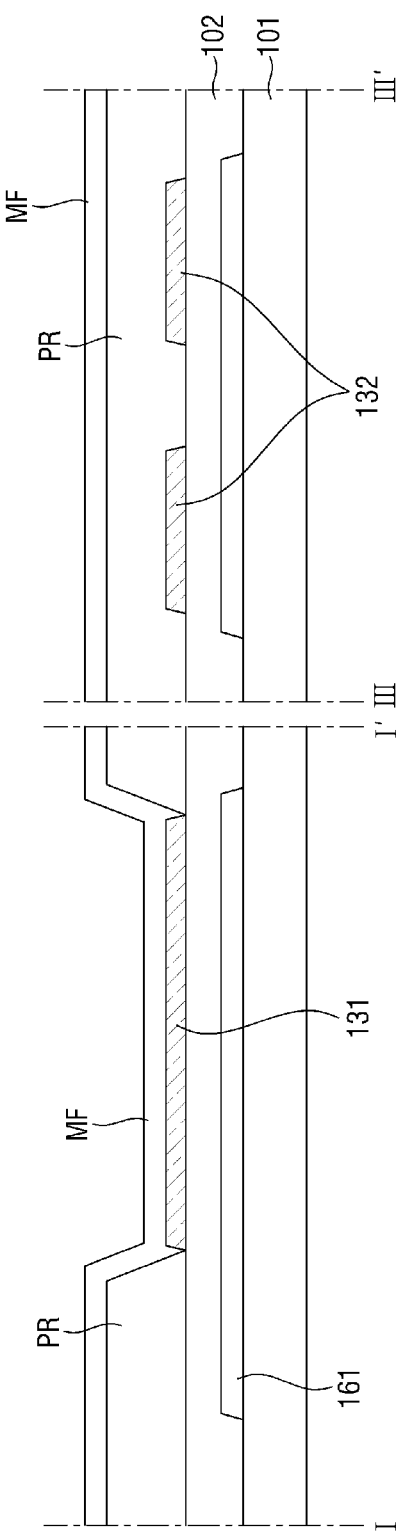
Figure 20C:
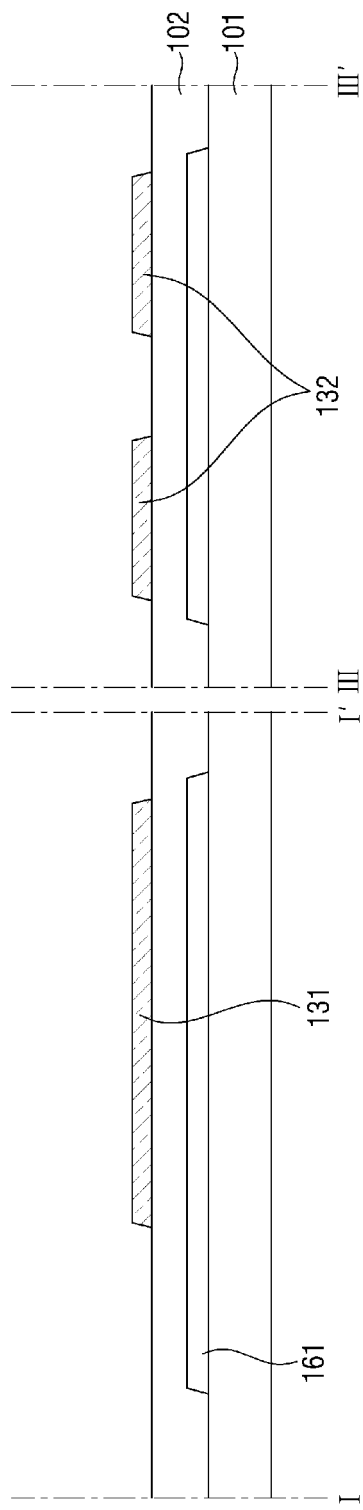

FIG. 19 is a flowchart illustrating a method of manufacturing a display device according to an embodiment. FIGS. 20A through 20C are cross-sectional views for explaining the method of manufacturing a display device according to this exemplary embodiment.

Each of FIGS. 20A through 20C includes a cross section taken along I-I' of FIG. 6 and a cross section taken along of FIG. 11. The exemplary embodiment of FIGS. 19 and 20A through 20C is different from the exemplary embodiment of FIGS. 17 and 18A through 18G in operations S203 through S205. In FIGS. 19 and 20A through 20C, a redundant description of the same elements and features as those of the exemplary embodiment of FIGS. 17 and 18A through 18G will be omitted, and differences from the exemplary embodiment of FIGS. 17 and 18A through 18G will be mainly described.

Operations S201, S202, S206 and S207 of FIG. 19 are substantially the same as operations S101, S102, S106 and S107 of FIG. 17, and thus a detailed description thereof will be omitted.

Referring to FIG. 20A, a first active layer 131 and a second active layer 132 are formed by patterning an active layer 130, and a photoresist PR is formed on the second active layer 132 (operation S203 in FIG. 18).

The first active layer 131 and the second active layer 132 may be formed by patterning the active layer 130 in an etching process using a photoresist pattern. The photoresist PR may be formed on the second active layer 132 or may be formed in an area excluding an area where the first active layer 131 is to be formed.

Then, referring to FIG. 20B, a metal film MF is formed on the photoresist PR and the first active layer 131 not covered by the photoresist PR (operation S204 in FIG. 18). The metal film MF may be copper (Cu), arsenic (As), antimony (Sb), lanthanum (La), a mixture of silver (Ag) and nitrogen (N), a mixture of boron (B) and nitrogen (N), or a mixture of gallium (Ga) and nitrogen (N). The metal film MF may be formed by sputtering.

Next, referring to FIG. 20C, the metal film MF is etched to dope the first active layer 131 with a metal, and the photoresist PR is removed (operation S205 in FIG. 18).

To prevent the active layer 130 from being damaged by an etchant used to etch the metal film MF, the etchant used to etch the metal film MF may be a solution that reacts only with the metal film MF and does not react with the active layer 130. For example, if the metal film MF is copper (Cu) and the first active layer 131 is an oxide semiconductor containing tin (Sn), the etchant may be a non-hydrogen peroxide solution including citric acid or ammonium persulfate to react with copper (Cu) and not react with the first active layer 131. The metal film MF may be etched by wet etching.

The metal doped into the first active layer 131 may be formed on upper and side surfaces of the first active layer 131. In addition, the proportion of the metal doped into the first active layer 131 in the first active layer 131 may be about 10 atomic % or less.

The photoresist PR may be removed by a strip process.

Figure 21:
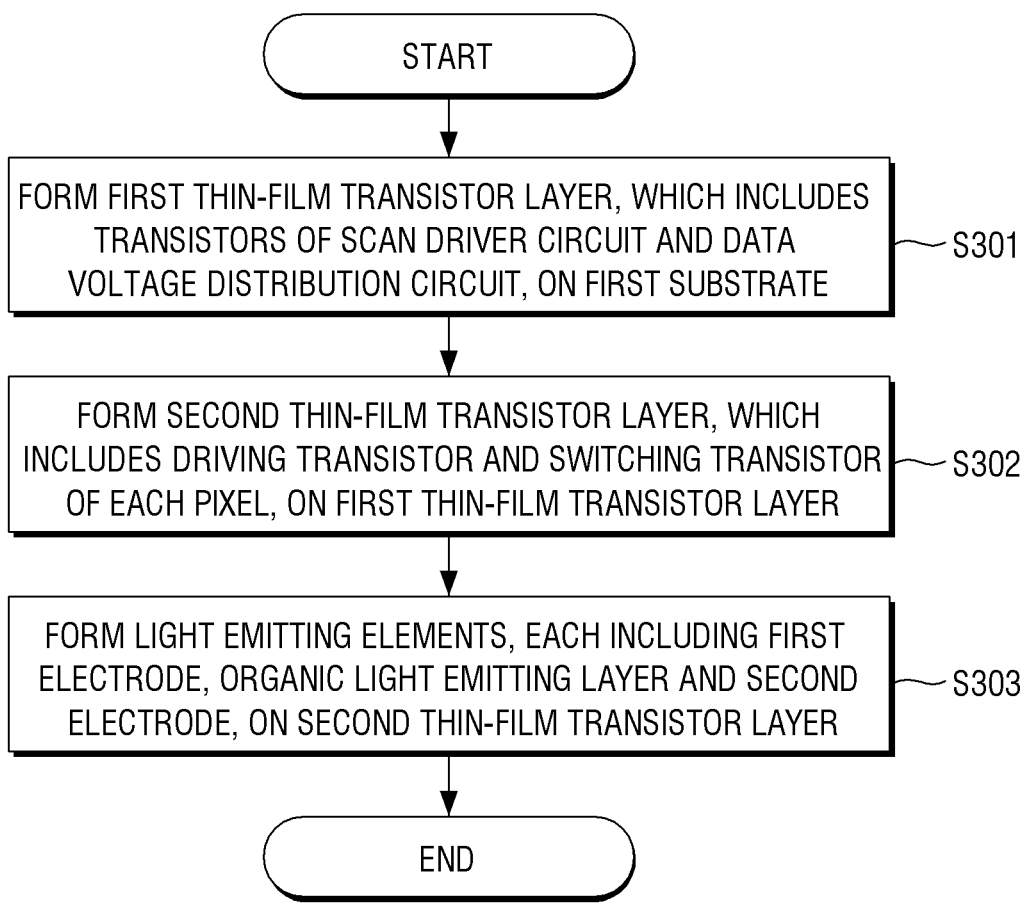
FIG. 21 is a flowchart illustrating a method of manufacturing a display device according to an exemplary embodiment.
Figure 22A:
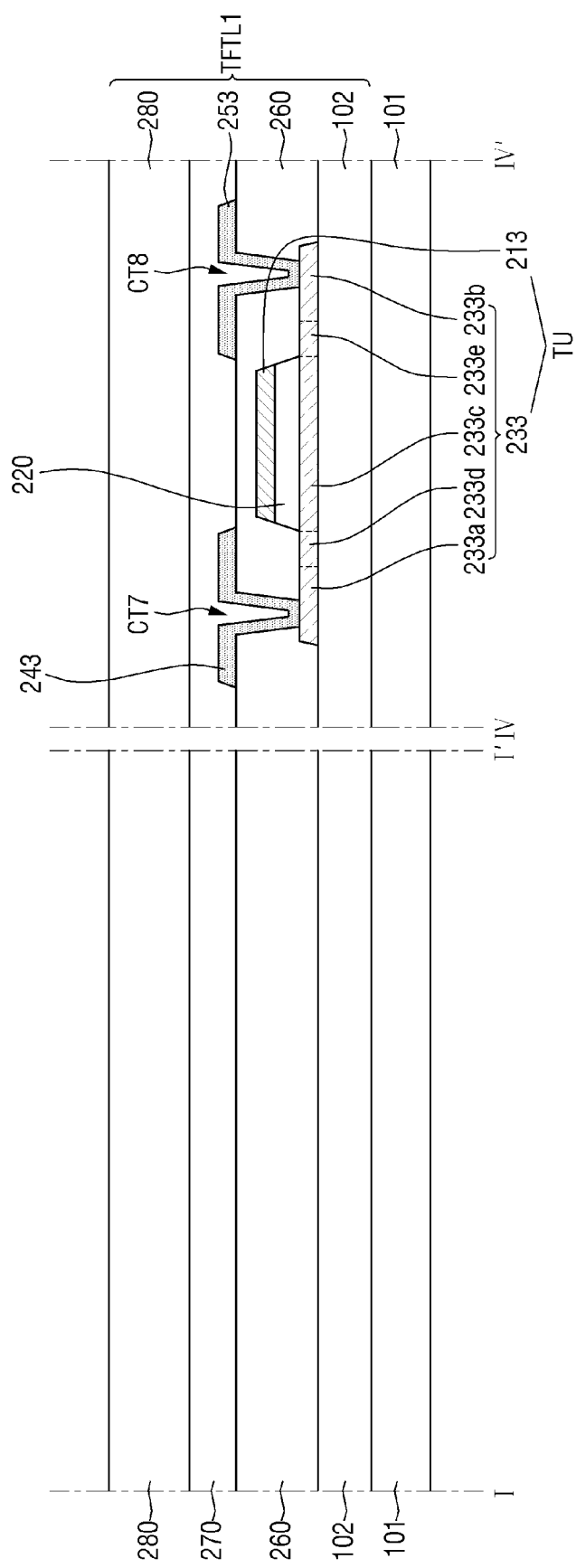
FIGS. 22A, 22B, and 22C are cross-sectional views for explaining the method of manufacturing a display device according to an exemplary embodiment.
Figure 22B:
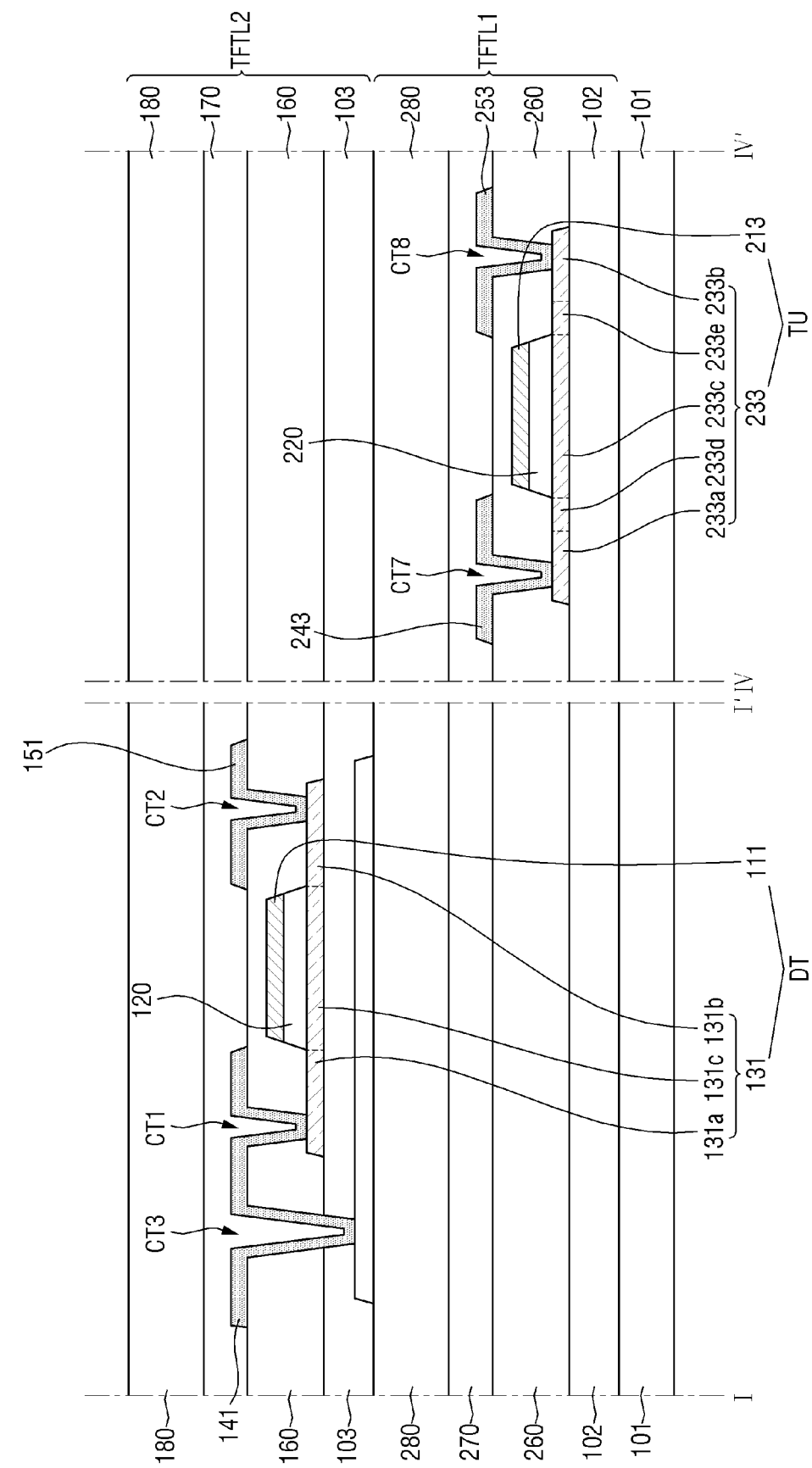
Figure 22C:
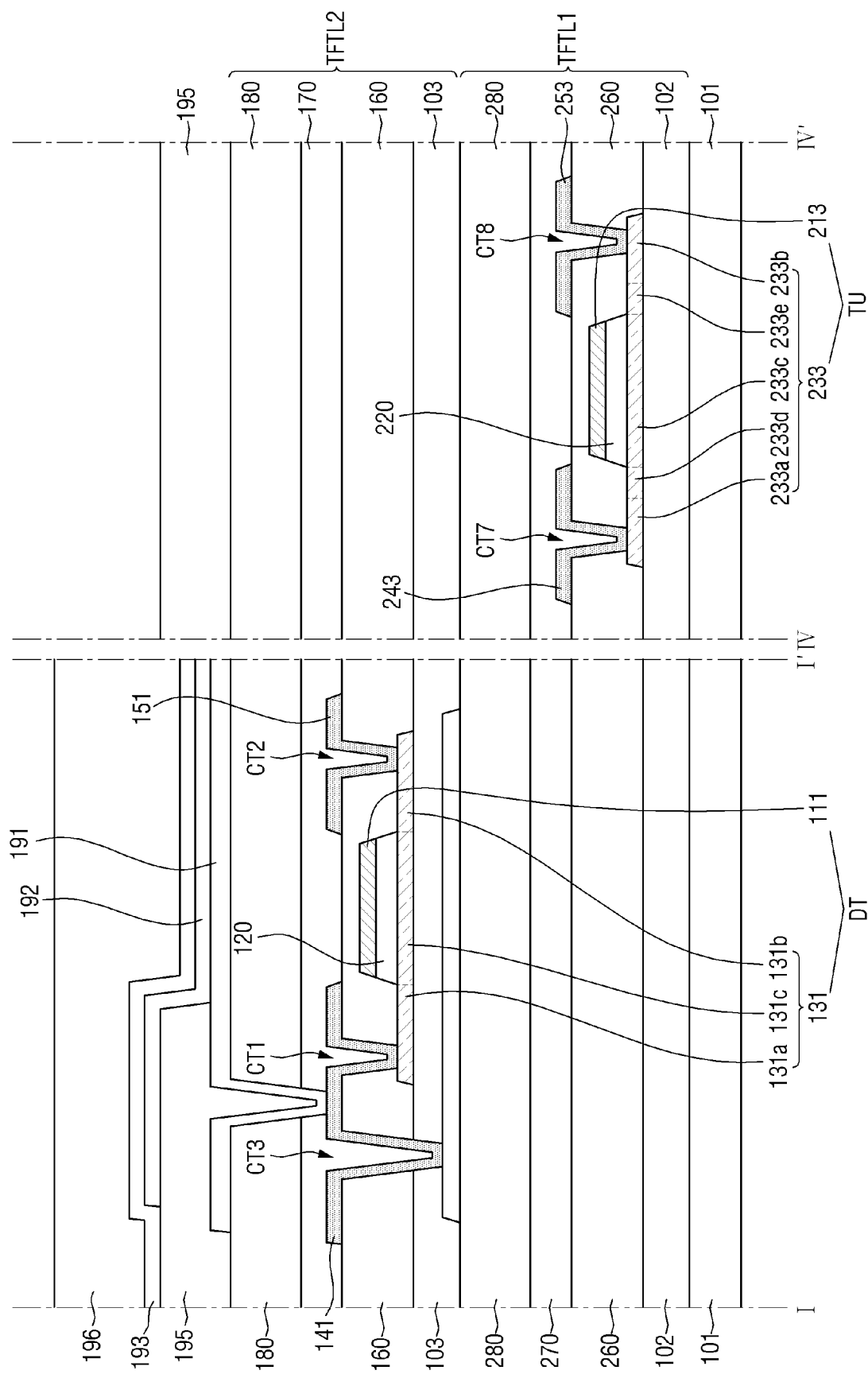

FIG. 21 is a flowchart illustrating a method of manufacturing a display device according to an exemplary embodiment. FIGS. 22A through 22C are cross-sectional views for explaining the method of manufacturing a display device according to the exemplary embodiment.

Each of FIGS. 22A through 22C includes a cross section taken along I-I' of FIG. 6 and a cross section taken along of FIG. 11.

First, a first thin-film transistor layer TFTL1 including a pull-up transistor TU, a pull-down transistor TD, and transistors of a node controller NC of a scan driver circuit SDC and first distribution transistors DT1 and second distribution transistors DT2 of a data voltage distribution circuit DMUX is formed on a first substrate 101. Each transistor formed in the first thin-film transistor layer TFTL1 may include polysilicon (operation S301 in FIG. 21).

Referring to FIG. 22A, the pull-up transistor TU, the pull-down transistor TD, and the transistors of the node controller NC of the scan driver circuit SDC may each include a third gate electrode 213, a third active layer 233, a third source electrode 243, a third drain electrode 253, and a third light shielding layer 263. In FIG. 22A, only the pull-up transistor TU of the scan driver circuit SDC is illustrated for ease of description.

The third light shielding layer 263 is formed on the first substrate 101, and a buffer layer 102 is formed on the third light shielding layer 263. The third light shielding layer 263 is a layer for blocking light from the first substrate 101 from entering the third active layer 233. The third light shielding layer 263 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials. The third light shielding layer 263 may be formed by patterning a light shielding metal layer, which is formed on the entire surface of the first substrate 101 by sputtering, in an etching process using a photoresist pattern.

The buffer layer 102 is formed on the third light shielding layer 263. The buffer layer 102 is a layer for protecting the pull-up transistor TU, the pull-down transistor TD, and the transistors of the node controller NC of the scan driver circuit SDC from moisture introduced through the first substrate 101. The buffer layer 102 may be composed of a plurality of inorganic layers stacked alternately. For example, the butter layer 102 may be a multilayer in which one or more inorganic layers selected from a silicon oxide ($SiO_x$) layer, a silicon nitride ($SiN_g$) layer, and SiON are alternately stacked. The buffer layer 102 may be formed by chemical vapor deposition.

The third active layer 233 is formed on the buffer layer 102. The third active layer 233 may be formed by patterning an active layer, which is formed on the entire surface of the buffer layer 102, in an etching process using a photoresist pattern. The third active layer 233 may include polysilicon.

A second gate insulating layer 220 is formed on the third active layer 233, and the third gate electrode 213 is formed on the second gate insulating layer 220.

The second gate insulating layer 220 may be an inorganic layer, for example, a silicon oxide ($SiO_x$) layer, a silicon nitride ($SiN_x$) layer, or a multilayer composed of these layers. The second gate insulating layer 220 may be formed by chemical vapor deposition. A ninth contact hole CT9 passing through the second gate insulating layer 220 and the buffer layer 102 to expose a portion of the third light shielding layer 263 may be formed in the second gate insulating layer 220 and the buffer layer 102.

The third gate electrode 213 may be a single layer or a multi layer made of any one or more of molybdenum (Mo), aluminum (Al), chromium (Cr), gold (Au), titanium (Ti), nickel (Ni), neodymium (Nd), copper (Cu), and alloys of these materials. The third gate electrode 213 may be formed by patterning a gate metal layer, which is formed on the entire surface of the second gate insulating layer 220 by sputtering, in an etching process using a photoresist pattern. The third gate electrode 213 may contact the third light shielding layer 263 through the ninth contact hole CT9 passing through the second gate insulating layer 220 and the buffer layer 102.

Here, heavy impurity doping may be performed to form heavily doped regions in the third active layer 223 before the photoresist pattern formed on the third gate electrode 213 is removed.

The second gate insulating layer 220 may be etched and patterned by using the third gate electrode 213 as a mask. Then, light impurity doping may be performed to form lightly doped regions in the third active layer 233.

A second interlayer insulating film 260 may be formed on the third gate electrode 213, and the third source electrode 243 and the third drain electrode 253 may be formed on the second interlayer insulating film 260.

The second interlayer insulating film 260 may be an inorganic layer, for example, a silicon oxide (SiO$_x$) layer, a silicon nitride (SiN$_x$) layer, or a multilayer composed of these layers. The second interlayer insulating film 260 may be formed by chemical vapor deposition.

A seventh contact hole CT7 passing through the second interlayer insulating film 260 to expose a portion of an upper surface of the second active layer 233 and an eighth contact CT8 passing through the second interlayer insulating film 260 to expose another portion of the upper surface of the third active layer 233 may be formed in the second interlayer insulating film 260.

Each of the third source electrode 243 and the third drain electrode 253 may be a single layer or a multilayer made of any one or more of molybdenum (Mo), aluminum (Al), chromium Cr), gold (Au), titanium (Ti), nickel (Ni), neodymium (Nd), copper (Cu), and alloys of these materials. The third source electrode 243 and the third drain electrode 253 may be formed by patterning a source drain metal layer, which is formed on the entire surface of the second interlayer insulating film 260 by sputtering, in an etching process using a photoresist pattern.

The third source electrode 243 may be formed to contact a first heavily doped region 233a formed on a side of the third active layer 233 through the seventh contact hole CT7. The third drain electrode 253 may be formed to contact a second heavily doped region 233b formed on the other side of the third active layer 233 through the eighth contact hole CT8.

A second protective layer 270 is formed on the third source electrode 243 and the third drain electrode 253. The second protective layer 270 may be an inorganic layer, for example, a silicon oxide (SiO$_x$) layer, a silicon nitride (SiN$_x$) layer, or a multi layer composed of these layers. The second protective layer 270 may be formed by chemical vapor deposition.

A second planarization layer 280 may be formed on the second protective layer 270 to flatten steps due to thin-film transistors such as the pull-up transistor TU, the pull-down transistor TD, and the transistors of the node controller NC of the scan driver circuit SDC. The second planarization layer 280 may be made of an organic layer such as acryl resin, epoxy resin, phenolic resin, polyamide resin, or polyimide resin.

Each of the first distribution transistors MT1 and the second distribution transistors MT2 of the data voltage distribution circuit DMUX may be formed substantially the same as the pull-up transistor TU, the pull-down transistor TD and the transistors of the node controller NC of the scan driver circuit SDC described above in operation S301 of FIG. 21, and thus, a detailed description thereof is omitted.

Second, a second thin-film transistor layer TFTL2 including a driving transistor DT and a switching transistor ST of each pixel P is formed on the first thin-film transistor layer TFTL1. In FIG. 22B, only the driving transistor DT of each pixel P is illustrated for ease of description. Each transistor formed in the second thin-film transistor layer TFTL2 may include an oxide semiconductor (operation S302 in FIG. 21).

The process of forming the second thin-film transistor layer TFTL2 is substantially the same as that of the exemplary embodiment described with reference to FIGS. 17 and 18A through 18G or the exemplary embodiment described with reference to FIGS. 19 and 20A through 20C except that a first light shielding layer 161 and a second light shielding layer 162 are formed not on the first substrate 101, but on a first planarization layer 180, and thus, a detailed description thereof is omitted.

Third, light emitting elements EL, each including a first electrode 191, an organic light emitting layer 192, and a second electrode 193, are formed on the second thin-film transistor layer TFTL2 (operation S303 in FIG. 21).

The first electrode 191 may be formed on the first planarization layer 180. The first electrode 191 may contact a source electrode 140 of the driving transistor DT through a contact hole CNT passing through a first protective layer 170 and the first planarization layer 180.

A pixel defining layer 195 may be formed on the first planarization layer 180 and may cover edges of the first electrode 191 to define pixels. That is, the pixel defining layer 195 serves as a pixel defining layer for defining pixels. Here, each of the pixels is an area in which the first electrode 191, the organic light emitting layer and the second electrode 193 are sequentially stacked so that holes from the first electrode 191 and electrons from the second electrode 193 combine together in the organic light emitting layer 192 to emit light.

The organic light emitting layer 192 may be disposed on the first electrode 191 and the pixel defining layer 195. The organic light emitting layer 192 may include a hole transporting layer, a light emitting layer, and an electron transporting layer. In addition, the organic light emitting layer 192 may be formed in a tandem structure of two stacks or more, in which case a charge generating layer may be formed between the stacks.

The second electrode 193 may be formed on the organic light emitting layer 192. The second electrode 193 may be a common layer common to all pixels.

The light emitting elements EL may be of a top emission type which emits light in a direction opposite to the first substrate 101, that is, in an upward direction. In this case, the first electrode 191 may be made of a metal material having high reflectivity, such as a stack (Ti/Al/Ti) of aluminum (Al) and titanium (Ti), a stack (ITO/Al/ITO) of aluminum (Al) and ITO, an APC alloy, or a stack (ITO/AlC/ITO) of an APC alloy and ITO. The APC alloy is an alloy of silver (Ag), palladium (Pd), and copper (Cu). In addition, the second electrode 193 may be made of a transparent conductive material (TCO) capable of transmitting light such as ITO or IZO or may be made of a semi-transmissive conductive material such as magnesium (Mg), silver (Ag) or an alloy of magnesium (Mg) and silver (Ag). When the second electrode 193 is made of a semi-transmissive conductive material, the light emission efficiency may be increased by micro-cavities.

An encapsulation layer 196 may be formed on the second electrode 193 to prevent introduction of oxygen or moisture.

The encapsulation layer 196 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the encapsulation layer 196 may include at least one organic layer to prevent particles from penetrating the encapsulation layer 196 and entering the organic light emitting layer 192 and the second electrode 193. The organic layer may be made of epoxy, acrylate, or urethane acrylate.

According to the exemplary embodiment of FIGS. 21 and 22A through 22C, the pull-up transistor TU, the pull-down transistor TD, and the transistors of the node controller NC of the scan driver circuit SDC and the first distribution transistors MT1 and the second distribution transistors MT2 of the data voltage distribution circuit DMUX may be thin-film transistors including a polysilicon active layer, and the driving transistor DT and the switching transistor ST of each pixel P may be transistors including an active layer of an oxide semiconductor.

According to the inventive concepts, in a display device including a thin-film transistor, and a method of manufacturing the display device according to an exemplary embodiment, a first active layer is doped with a metal. Therefore, electrons moving through a channel region of the first active layer can be trapped. In this case, due to the metal doped into the first active layer, the slope of a driving current (drain-source current) curve according to a gate voltage of a driving transistor may be reduced. Therefore, even if a driving current of each pixel is reduced as the number of pixels increases in a high-resolution flat panel display device, a reduction in the driving voltage range of the driving transistor can be prevented or reduced.

According to the inventive concepts, in a display device including a thin-film transistor, and a method of manufacturing the display device according to an exemplary embodiment, transistors of a scan driver circuit and transistors of a data voltage distribution circuit may be thin-film transistors including an active layer of polysilicon, and a driving transistor and a switching transistor of each pixel may be thin-film transistors including an active layer of an oxide semiconductor.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising a pixel connected to a scan line and a data line intersecting the scan line,
   wherein:
   the pixel comprises:
   a light emitting element and a driving transistor configured to control a driving current supplied to the light emitting element according to a data voltage applied from the data line; and
   a scan transistor for applying the data voltage of the data line to a first gate electrode of the driving transistor according to a scan signal transmitted to the scan line;
   the driving transistor comprises a first active layer including an oxide semiconductor doped with a metal;
   the scan transistor comprises:
   a second active layer having an oxide semiconductor;
   a second light shielding layer disposed under the second active layer; and
   a second gate electrode disposed on the second active layer; and
   the second gate electrode contacts the second light shielding layer through a sixth contact hole passing through a gate insulating layer disposed between the second active layer and the second gate electrode and an insulating layer disposed between the second active layer and the second light shielding layer.

2. The display device of claim 1, wherein the proportion of the metal in the first active layer is about 10 atomic % or less.

3. The display device of claim 1, wherein the metal is copper (Cu), arsenic (As), antimony (Sb), lanthanum (La), a mixture of silver (Ag) and nitrogen (N), a mixture of boron (B) and nitrogen (N), or a mixture of gallium (Ga) and nitrogen (N).

4. The display device of claim 1, wherein the metal is copper (Cu), and the oxide semiconductor comprises tin (Sn).

5. The display device of claim 4, wherein the first active layer comprises indium-gallium-tin oxide (IGTO) or indium-gallium-zinc-tin oxide (IGZTO).

6. The display device of claim 1, wherein the metal is doped into an upper surface of the first active layer.

7. The display device of claim 6, wherein the metal is doped into at least one side surface of the first active layer.

8. The display device of claim 1, wherein the first active layer comprises a first conducting region, a second conducting region, and a channel region disposed between the first conducting region and the second conducting region.

9. The display device of claim 8, wherein the driving transistor comprises:
   a first light shielding layer disposed under the first active layer;
   a first gate electrode disposed on the first active layer;
   a first source electrode connected to the first conducting region through a first contact hole passing through an interlayer insulating film disposed on the first gate electrode; and
   a first drain electrode connected to the second conducting region through a second contact hole passing through the interlayer insulating film.

10. The display device of claim 9, wherein the first source electrode contacts the first light shielding layer through a third contact hole passing through the interlayer insulating film and an insulating layer disposed between the first active layer and the first light shielding layer.

11. The display device of claim 1, wherein the second active layer is not doped with the metal.

12. The display device of claim 1, further comprising a scan driver circuit configured to output a scan signal to the scan line,
   wherein:
   the scan driver circuit comprises a pull-up transistor configured to output a gate-on voltage when the pull-up transistor is charged with the gate-on voltage; and
   the pull-up transistor comprises a third active layer including an oxide semiconductor.

13. The display device of claim 12, wherein the third active layer is not doped with the metal.

14. The display device of claim 12, wherein the pull-up transistor further comprises:
   a third light shielding layer disposed under the third active layer; and
   a third gate electrode disposed on the third active layer.

15. A display device comprising:
a pixel connected to a scan line and a data line intersecting the scan line; and
a scan driver circuit configured to output a scan signal to the scan line,
wherein:
the pixel comprises a light emitting element and a driving transistor configured to control a driving current supplied to the light emitting element according to a data voltage applied from the data line;
the driving transistor comprises a first active layer including an oxide semiconductor doped with a metal;
the scan driver circuit comprises a pull-up transistor configured to output a gate-on voltage when the pull-up transistor is charged with the gate-on voltage;
the pull-up transistor comprises:
  a third active layer including an oxide semiconductor;
  a third light shielding layer disposed under the third active layer; and
  a third gate electrode disposed on the third active layer; and the third gate electrode contacts the third light shielding layer through a ninth contact hole passing through a gate insulating layer disposed between the third active layer and the third gate electrode and an insulating layer disposed between the third active layer and the third light shielding layer.

16. The display device of claim 1, further comprising a data voltage distribution circuit which comprises a first distribution transistor connected between a routing line and the data line and a second distribution transistor connected between the routing line and another data line adjacent to the data line, wherein each of the first distribution transistor and the second distribution transistor comprises a fourth active layer including polysilicon.

* * * * *